United States Patent
Yang et al.

(10) Patent No.: US 9,887,314 B2
(45) Date of Patent: Feb. 6, 2018

(54) METHOD OF MANUFACTURING SOLAR CELL

(71) Applicant: LG ELECTRONICS INC., Seoul (KR)

(72) Inventors: Youngsung Yang, Seoul (KR); Hyungjin Kwon, Seoul (KR); Chungyi Kim, Seoul (KR); Junghoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/178,274

(22) Filed: Jun. 9, 2016

(65) Prior Publication Data

US 2016/0365472 A1    Dec. 15, 2016

(30) Foreign Application Priority Data

Jun. 10, 2015  (KR) .................. 10-2015-0082111
May 2, 2016    (KR) .................. 10-2016-0053932

(51) Int. Cl.
| | | |
|---|---|---|
| *H01L 21/00* | (2006.01) | |
| *H01L 31/18* | (2006.01) | |
| *H01L 31/0216* | (2014.01) | |
| *H01L 31/068* | (2012.01) | |
| *H01L 21/02* | (2006.01) | |

(52) U.S. Cl.
CPC .... *H01L 31/1868* (2013.01); *H01L 21/02131* (2013.01); *H01L 31/02167* (2013.01); *H01L 31/0682* (2013.01); *H01L 31/1864* (2013.01); *Y02E 10/547* (2013.01)

(58) Field of Classification Search
CPC ............. H01L 31/1864; H01L 31/1868; H01L 31/02167; H01L 31/022441; H01L 31/02363; H01L 31/0682
USPC ............................. 438/57, 67; 136/255, 256
See application file for complete search history.

(56) References Cited

U.S. PATENT DOCUMENTS

| | | | |
|---|---|---|---|
| 6,387,827 B1 | 5/2002 | Mertens et al. | |
| 2009/0197391 A1* | 8/2009 | Ohnuma | ........... H01L 21/76254 438/458 |

(Continued)

FOREIGN PATENT DOCUMENTS

| | | |
|---|---|---|
| CN | 101329999 A | 12/2008 |
| CN | 101587920 A | 11/2009 |

(Continued)

OTHER PUBLICATIONS

Jackson et al., "Improved performance of surface-passivated solar cells by chlorine-containing oxides," Journal of Applied Physics, vol. 57, No. 10, May 15, 1985, XP820256, pp. 4742-4745.

*Primary Examiner* — Brook Kebede
(74) *Attorney, Agent, or Firm* — Birch, Stewart, Kolasch & Birch, LLP

(57) ABSTRACT

Disclosed is a method of manufacturing a solar cell. The method includes forming a protective film using an insulation film over a semiconductor substrate, the semiconductor substrate including a base area of a first conductive type and formed of crystalline silicon. The forming of the protective film includes a heat treatment process performed at a heat treatment temperature of 600 degrees Celsius or more under a gas atmosphere including a halogen gas, which has a halogen element.

20 Claims, 14 Drawing Sheets

(56) References Cited

U.S. PATENT DOCUMENTS

| | | | |
|---|---|---|---|
| 2010/0065117 A1* | 3/2010 | Kim | H01L 31/0236 136/256 |
| 2010/0117203 A1 | 5/2010 | Bailey et al. | |
| 2011/0140226 A1* | 6/2011 | Jin | H01L 31/02168 257/460 |
| 2011/0308591 A1* | 12/2011 | Yamazaki | H01L 31/02168 136/255 |
| 2012/0322199 A1 | 12/2012 | Graff | |
| 2014/0065764 A1 | 3/2014 | Scardera et al. | |

FOREIGN PATENT DOCUMENTS

| | | |
|---|---|---|
| CN | 103972327 A | 8/2014 |
| EP | 2879189 A2 | 6/2015 |
| EP | 2955760 A1 | 12/2015 |
| JP | 11-102906 A | 4/1999 |
| JP | 2000-68266 A | 3/2000 |
| JP | 2011-222682 A | 11/2011 |
| JP | 2011-249780 A | 12/2011 |
| JP | 2014-519723 A | 8/2014 |
| JP | 2015-15472 A | 1/2015 |
| KR | 10-2015-0045801 A | 4/2015 |
| WO | WO 2014/098987 A1 | 6/2014 |

* cited by examiner

METHOD OF MANUFACTURING SOLAR CELL

CROSS-REFERENCE TO RELATED APPLICATION

This application claims the priority benefit of Korean Patent Application No. 10-2015-0082111, filed on Jun. 10, 2015 and No. 10-2016-0053932, filed on May 2, 2016 in the Korean Intellectual Property Office, the disclosure of which is incorporated herein by reference.

BACKGROUND OF THE INVENTION

Field of the Invention

The present invention relates to a method of manufacturing a solar cell, and more particularly to a method of manufacturing a solar cell having a protective film formed over a semiconductor substrate or over a conductive area.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on some design. The efficiency of solar cells may be determined by the design of the various layers and electrodes. In order for solar cells to be commercialized, the problem of low efficiency needs to be overcome, and thus, there is a demand to design the various layers and electrodes so as to maximize the efficiency of solar cells.

In one example, solar cells are provided with various protective films, in order to realize the passivation, physical protection, and electrical insulation of a semiconductor substrate or a semiconductor layer. These protective films may be formed by, for example, thermal oxidation or deposition. A protective film formed by thermal oxidation may make it difficult to precisely control the thickness thereof and to achieve excellent film properties. In addition, deposition is performed under an atmosphere including source gas, which contains elements for constituting a protective film, and, as needed, carrier gas. However, the protective film, formed using only basic gas, such as a source gas and carrier gas, may have a high interface trap density and may not provide good passivation for a semiconductor substrate or a semiconductor layer. Therefore, there is demand for a method of manufacturing a protective film having good properties.

SUMMARY OF THE INVENTION

Therefore, the embodiments of the present invention have been made in view of the above problems, and it is an object of the present invention to provide a method of manufacturing a solar cell, which enables the manufacture of a solar cell having good efficiency through the formation of a protective film having good properties.

In accordance with an aspect of the present invention, the above and other objects can be accomplished by the provision of a method of manufacturing a solar cell including forming a protective film using an insulation film over a semiconductor substrate, the semiconductor substrate including a base area of a first conductive type and formed of crystalline silicon. The forming of the protective film includes a heat treatment process performed at a heat treatment temperature of 600 degrees Celsius or more under a gas atmosphere including halogen gas, which has a halogen element.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

Figure 1:
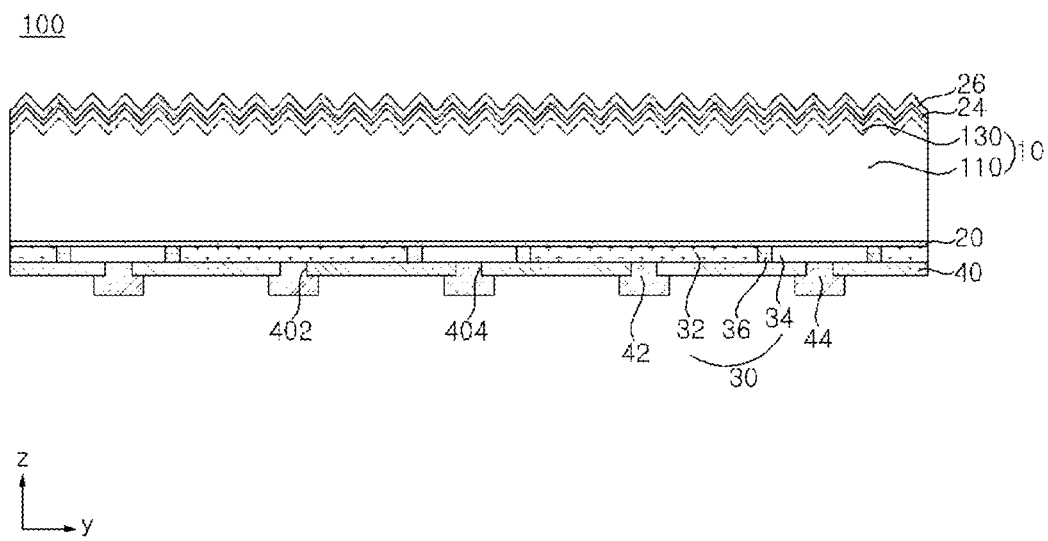
FIG. 1 is a sectional view illustrating one example of a solar cell manufactured by a method of manufacturing the solar cell in accordance with one embodiment of the present invention.

Reference will now be made in detail to the example embodiments of the present invention, examples of which are illustrated in the accompanying drawings. However, it will be understood that the present invention should not be limited to the embodiments and may be modified in various ways.

In the drawings, to clearly and briefly explain the present invention, illustration of elements having no connection with the description is omitted, and the same or extremely similar elements are designated by the same reference numerals throughout the specification. In addition, in the drawings, for a more clear explanation, the dimensions of elements, such as thickness, width, and the like, are exaggerated or reduced, and thus the thickness, width, and the like of the embodiments of the present invention are not limited to the illustration of the drawings.

In addition, in the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "over" another element, it can be directly over the other element or intervening elements may also be present. On the other hand, when an element such as a layer, film, region or substrate is referred to as being "directly over" another element, this means that there are no intervening elements therebetween.

Hereinafter, a method of manufacturing a solar cell in accordance with the embodiments of the present invention will be described with reference to the accompanying drawings. One example of a solar cell, manufactured by the method of manufacturing the solar cell in accordance with the embodiments of the present invention, will first be described, and thereafter, the method of manufacturing the solar cell in accordance with the embodiments of the present invention will be described.

Figure 2:
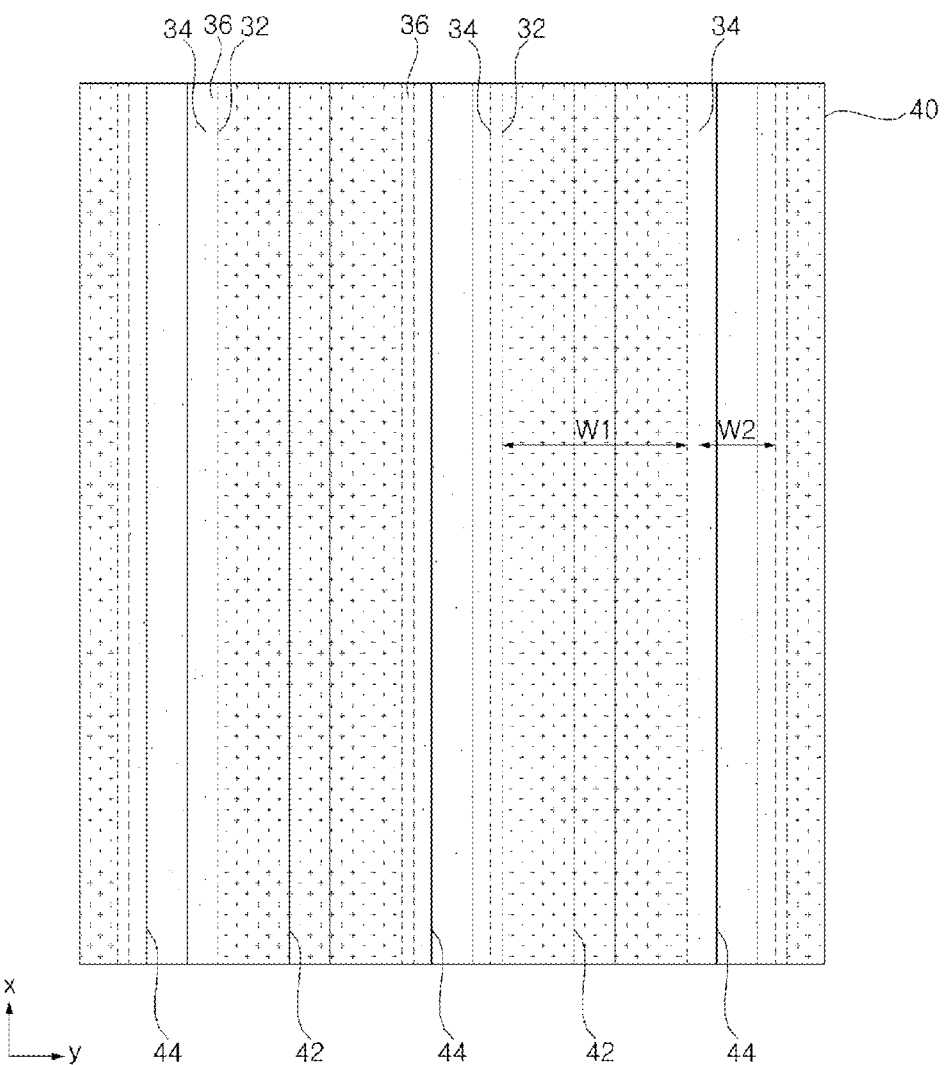
FIG. 2 is a partial rear plan view of the solar cell illustrated in FIG. 1.

FIG. 1 is a sectional view illustrating one example of a solar cell, manufactured by a method of manufacturing the solar cell, in accordance with an embodiment of the present invention, and FIG. 2 is a partial rear plan view of the solar cell illustrated in FIG. 1.

With reference to FIGS. 1 and 2, the solar cell, designated by reference numeral 100, in accordance with the present embodiment includes a semiconductor substrate 10 including a base area 110, conductive areas 32 and 34 formed on or over the semiconductor substrate 10, electrodes 42 and 44 connected to the conductive areas 32 and 34, and a protective film formed over (e.g. in contact with) the semiconductor substrate 10. The present embodiment illustrates that a control passivation layer 20, disposed over the semiconductor substrate 10, constitutes the aforementioned protective film, and a semiconductor layer 30, which includes the conductive areas 32 and 34, is disposed over the control passivation layer 20. Here, the semiconductor layer 30 includes a first conductive area 32 of a first conductive type and a second conductive area 34 of a second conductive type, and an intrinsic barrier area 36 may be interposed between the first conductive area 32 and the second conductive area 34. In addition, the electrodes 42 and 44 may include a first electrode 42 connected to the first conductive area 32 and a second electrode 44 connected to the second conductive area 34. In addition, the solar cell 100 may further include additional protective films, such as a front passivation film 24, an anti-reflection film 26, and a back passivation film 40. Here, the protective films may be insulation films for protecting the semiconductor substrate 10 or the conductive areas 32 and 34. The aforementioned constituent elements will be described below in more detail.

The semiconductor substrate 10 may include the base area 110, which includes a second conductive dopant at a relatively low doping concentration, thus being of the second conductive type. The base area 110 may be formed of crystalline semiconductors including the second conductive dopant. In one example, the base area 110 may be formed of monocrystalline or polycrystalline semiconductors (e.g. monocrystalline or polycrystalline silicon) including the second conductive dopant. More particularly, the base area 110 may be formed of monocrystalline semiconductors including the second conductive dopant (e.g. a monocrystalline semiconductor wafer, and for example, a semiconductor silicon wafer). The use of the base area 110 or the semiconductor substrate 10 having high crystallinity and thus low defects ensures excellent electrical properties.

The second conductive type may be a p-type or an n-type. In one example, when the base area 110 is of an n-type, the p-type first conductive area 32 may be widely formed in order to increase a photoelectric conversion area. Both the base area 110 and the p-type first conductive area 32 form a junction (e.g. a pn junction) with the control passivation layer 20 interposed therebetween for forming carriers via photoelectric conversion. In addition, in this instance, the first conductive area 32 having a wide area may effectively collect holes, which move relatively slowly, thereby contributing to an increase in photoelectric conversion efficiency. However, the embodiment of the present invention is not limited thereto.

In addition, the semiconductor substrate 10 may include a front field area (or a field area) 130 disposed on the front surface of the semiconductor substrate 10. The front field area 130 may be of the same conductive type as the conductive type of the base area 110, but may have a higher doping concentration than the base area 110. Therefore, the front field area 30 may constitute a conductive area or a dopant area.

The present embodiment illustrates the configuration in which the front field area 130 is a doped area formed by doping the semiconductor substrate 10 with the second conductive dopant at a relatively high doping concentration. As such, the front field area 130 includes crystalline (monocrystalline or polycrystalline) semiconductors of the second conductive type so as to constitute a portion of the semiconductor substrate 10. In one example, the front field area 130 may constitute a portion of a monocrystalline semiconductor substrate (e.g. a monocrystalline silicon wafer substrate) of the second conductive type. At this time, the doping concentration of the front field area 130 may be lower than the doping concentration of the second conductive area 34, which is of the same second conductive type as the conductive type of the front field area 130.

However, the embodiment of the present invention is not limited thereto. Thus, the front field area 130 may be formed by doping a semiconductor layer (e.g. an amorphous semiconductor layer, a microcrystalline semiconductor layer, or a polycrystalline semiconductor layer), separate from the semiconductor substrate 10, with the second conductive dopant. Alternatively, the front field area 130 may be an area, which serves similar to an area doped with a fixed charge of a layer (e.g. the front passivation film 24 and/or the anti-reflection film 26), which is formed adjacent to the semiconductor substrate 10. For example, when the base area 110 is of an n-type, the front passivation film 24 may be formed of an oxide having a negative fixed charge (e.g. an aluminum oxide) so as to form an inversion layer on the surface of the base area 110. Thereby, the inversion layer may be used as a field area. In this instance, the semiconductor substrate 10 may include only the base area 110 without a separate doped area, which may minimize defects of the semiconductor substrate 10. Various other configurations of the front field area 130 may be formed using various other methods.

In the present embodiment, the front surface of the semiconductor substrate 10 may be subjected to texturing so that the front surface is provided with protrusions having, for example, a pyramidal shape. The resulting texture formed on the semiconductor substrate 10 may have a given shape (e.g. a pyramidal shape) having an outer surface formed on a specific crystal face (e.g. (111) face) of semiconductors. When the roughness of, for example, the front surface of the semiconductor substrate 10 is increased by the protrusions formed on the front surface via texturing, it is possible to reduce the reflectance of light introduced through the front surface of the semiconductor substrate 10. Accordingly, the quantity of light, which reaches the pn junction formed by the base area 110 and the first conductive area 32, may be increased, which may minimize the loss of light.

In addition, the back surface of the semiconductor substrate 10 may be formed via, for example, mirror surface grinding, and thus may be a relatively smooth flat surface, which has a lower surface roughness than that of the front surface. In the instance where both the first and second conductive areas 32 and 34 are formed on the back surface of the semiconductor substrate 10 as in the present embodiment, the properties of the solar cell 100 may be greatly changed according to the properties of the back surface of the semiconductor substrate 10. Therefore, the back surface of the semiconductor substrate 10 may have no protrusion formed via texturing in order to improve passivation, which may consequently improve the properties of the solar cell 100. However, the embodiment of the present invention is not limited thereto. In some instances, the back surface of the semiconductor substrate 10 may be provided with protrusions via texturing. Various other alterations are possible.

The control passivation layer 20, which is a protective film formed over the semiconductor substrate 10, may be formed on the back surface of the semiconductor substrate 10. In one example, the control passivation layer 20 may come into contact with the back surface of the semiconductor substrate 10, which may result in the simplified configuration. In addition, the control passivation layer 20 may be formed on the entire back surface of the semiconductor substrate 10, so as to be formed via a simplified process without additional patterning. However, the embodiment of the present invention is not limited thereto, and various alterations in terms of, for example, the shape of the control passivation layer 20 are possible.

The control passivation layer 20 may serve as a diffusion barrier for preventing dopants in the conductive areas 32 and 34 from being diffused to the semiconductor substrate 10. The control passivation layer 20 may include various materials to enable the passage of a plurality of carriers therethrough. In one example, the control passivation layer 20 may include an oxide or a nitride. More particularly, the control passivation layer 20 may be a silicon oxide layer including a silicon oxide. This is because the silicon oxide layer has good passivation and ensures easy carrier movement. The control passivation layer 20 may be a layer formed by wet chemical oxidation and/or thermal oxidation under specific conditions. This will be described later in more detail.

At this time, the control passivation layer 20 may be thinner than the back passivation film 40. In one example, the thickness of the control passivation layer 20 may be 5 nm or less (for example, 2 nm or less, e.g. within a range from 1 nm to 2 nm). When the thickness of the control passivation layer 20 exceeds 5 nm, smooth carrier movement does not occur, which prevents the solar cell 100 from operating. In order to ensure smoother carrier movement, the thickness of the control passivation layer 20 may be 2 nm or less. The control passivation layer 20, which has a small thickness of 2 nm or less as described above, may ensure the smooth transfer of carriers, which may enhance the fill factor (FF) of the solar cell 100. When the thickness of the control passivation layer 20 is below 1 nm, it may be difficult to form the control passivation layer 20 having desired qualities. However, the embodiment of the present invention is not limited thereto, and the thickness of the control passivation layer 20 may have any of various values.

The semiconductor layer 30, which includes the conductive areas 32 and 34, may be disposed over the control passivation layer 20. In one example, the semiconductor layer 30 may come into contact with the control passivation layer 20, which may simplify the entire configuration. However, the embodiment of the present invention is not limited thereto.

In the present embodiment, the semiconductor layer 30 may include the first conductive area 32, which includes a first conductive dopant and exhibits a first conductive type, and the second conductive area 34, which includes a second conductive dopant and exhibits a second conductive type. The first conductive area 32 and the second conductive area 34 may be located in the same plane over the control passivation layer 20. That is, there may be no layer interposed between the first conductive area 32 and the control passivation layer 20 and between the second conductive area 34 and the control passivation layer 20. Alternatively, when another layer is interposed between the first and second conductive areas 32 and 34 and the control passivation layer 20, the interposed layer may have the same stacking configuration between the first conductive area 32 and the control passivation layer 20 and between the second conductive area 34 and the control passivation layer 20. In addition, the barrier area 36 may be located between the first conductive area 32 and the second conductive area 34 in the same plane as the conductive areas 32 and 34.

The first conductive area 32 is an emitter area, which forms a pn junction (or a pn tunnel junction) with the base area 110 with the control passivation layer 20 interposed therebetween, so as to generate carriers via photoelectric conversion.

At this time, the first conductive area 32 may include a semiconductor (e.g. silicon) including the first conductive dopant, which is contrary to that of the base area 110. In the present embodiment, the first conductive area 32 is a semiconductor layer, which is separately formed over the semiconductor substrate 10 (more particularly, over the control passivation layer 20) and which is doped with a first conductive dopant. As such, the first conductive area 32 may be a semiconductor layer, which has a different crystalline structure from that of the semiconductor substrate 10 so as to be easily formed on the semiconductor substrate 10. For example, the first conductive area 32 may be formed by doping, for example, an amorphous semiconductor, a microcrystalline semiconductor, or a polycrystalline semiconductor (e.g. amorphous silicon, microcrystalline silicon, or polycrystalline silicon), which may be easily fabricated via various methods such as, for example, deposition, with the first conductive dopant. The first conductive dopant may be introduced to the semiconductor layer while the semiconductor layer is formed, or may be introduced to the semiconductor layer after the semiconductor layer is formed, via any of various doping methods, such as thermal diffusion or ion implantation.

At this time, the first conductive area 32 may include the first conductive dopant, which may exhibit a conductive type contrary to that of the base area 110. That is, when the first conductive dopant is a p-type dopant, it may use a group III element, such as boron (B), aluminum (Al), gallium (Ga), or indium (In). When the first conductive dopant is an n-type dopant, it may use a group V element, such as phosphorus (P), arsenic (As), bismuth (Bi), or antimony (Sb). In one example, the first conductive dopant may be boron (B), which is of a p-type.

The second conductive area 34 serves as a back field area, which forms a back field to prevent the loss of carriers from the surface of the semiconductor substrate 10 (for example, the back surface of the semiconductor substrate 10) due to recombination.

At this time, the second conductive area 34 may include a semiconductor (e.g. silicon), which includes the same second conductive dopant as the conductive type of the base area 110. In the present embodiment, the second conductive area 34 is a semiconductor layer, which is separately formed over the semiconductor substrate 10 (more clearly, over the control passivation layer 20) and which is doped with the second conductive dopant. As such, the second conductive area 34 may be a semiconductor layer having a crystalline structure, which is different from that of the semiconductor substrate 10, so as to be easily formed on the semiconductor substrate 10. For example, the second conductive area 34 may be formed by doping, for example, an amorphous semiconductor, a microcrystalline semiconductor, or a polycrystalline semiconductor (e.g. amorphous silicon, microcrystalline silicon, or polycrystalline silicon), which may be easily fabricated via various methods such as, for example, deposition, with the second conductive dopant. The second conductive dopant may be introduced to the semiconductor layer while the semiconductor layer is formed, or may be introduced to the semiconductor layer after the semiconductor layer is formed, via any of various doping methods, such as thermal diffusion or ion implantation.

At this time, the second conductive area 34 may include the second conductive dopant, which may exhibit the same conductive type as the conductive type of the base area 110. That is, when the second conductive dopant is an n-type dopant, it may use a group V element, such as phosphorus (P), arsenic (As), bismuth (Bi), or antimony (Sb). When the second conductive dopant is an n-type dopant, it may use a group III element, such as boron (B), aluminum (Al), gallium (ga), or indium (In). In one example, the second conductive dopant may be phosphorus (P), which is of an n-type.

In addition, the barrier area 36 is located between the first conductive area 32 and the second conductive area 34 so that the first conductive area 32 and the second conductive area 34 are spaced apart from each other. When the first conductive area 32 and the second conductive area 34 come into contact with each other, shunts occur, undesirably causing deterioration in the performance of the solar cell 100. However, in the present embodiment, it is possible to prevent unnecessary shunts by positioning the barrier area 36 between the first conductive area 32 and the second conductive area 34.

The barrier area 36 may include any of various materials, which may be located between the first conductive area 32 and the second conductive area 34 so as to substantially insulate the conductive areas 32 and 34 from each other.

That is, the barrier area 36 may be formed of an undoped insulation material (e.g. an oxide or a nitride). Alternatively, the barrier area 36 may include an intrinsic semiconductor. At this time, the first conductive area 32, the second conductive area 34 and the barrier area 36 may be formed of the same semiconductor (e.g. amorphous silicon, microcrystalline silicon or polycrystalline silicon), which is continuously formed such that side surfaces of the three areas 32, 34 and 36 come into contact with one another. The barrier area 36 may include an i-type (intrinsic) semiconductor material, which substantially includes no dopant. In one example, after a semiconductor layer including a semiconductor material is formed, a portion of the semiconductor layer is doped with the first conductive dopant so as to form the first conductive area 32 and another portion of the semiconductor layer is doped with the second conductive dopant so as to form the second conductive area 34, whereby the remaining area on which the first conductive area 32 and the second conductive area 34 are not formed may be the barrier area 36. In this way, the manufacture of the first conductive area 32, the second conductive area 34, and the barrier area 36 may be simplified.

However, the embodiment of the present invention is not limited thereto. Thus, when the barrier area 36 is formed separately from the first conductive area 32 and the second conductive area 34, the thickness of the barrier area 36 may differ from those of the first conductive area 32 and the second conductive area 34. In one example, in order to more effectively prevent short-circuit between the first conductive area 32 and the second conductive area 34, the barrier area 36 may be thicker than the first conductive area 32 and the second conductive area 34. Alternatively, in order to reduce the amount of raw materials required to form the barrier area 36, the barrier area 36 may be thinner than the first conductive area 32 and the second conductive area 34. Of course, various other alterations are possible. In addition, the basic constituent material of the barrier area 36 may differ from those of the first conductive area 32 and the second conductive area 34.

In addition, the present embodiment illustrates the configuration in which the barrier area 36 causes the first conductive area 32 and the second conductive area 34 to be wholly spaced apart from each other. However, the embodiment of the present invention is not limited thereto. Accordingly, the barrier area 36 may be formed to cause the first conductive area 32 and the second conductive area 34 to be spaced apart from each other only along a portion of the boundary therebetween. Thereby, the conductive areas 32 and 34 may come into contact with each other along the remaining portion of the boundary between the first conductive area 32 and the second conductive area 34.

Here, the first conductive area 32, which is of a different conductive type from the conductive type of the base area 110, may be wider than the second conductive area 34, which is of the same conductive type as the conductive type of the base area 110. As such, the pn junction, which is formed through the control passivation layer 20 between the base area 110 and the first conductive area 32, may have an increased width. At this time, when the conductive type of the base area 110 and the second conductive area 34 is an n-type and the conductive type of the first conductive area 32 is a p-type, the wide first conductive area 32 may effectively collect holes, which move relatively slowly. The plan configuration of the first conductive area 32, the second conductive area 34, and the barrier area 36 will be described below in more detail with reference to FIG. 2.

The back passivation film 40 may be formed over the first and second conductive areas 32 and 34 and the barrier area 36 on the back surface of the semiconductor substrate 10. In one example, the back passivation film 40 may be formed so as to come into contact with the first and second conductive areas 32 and 34 and the barrier area 36, thus having a simplified configuration. However, the embodiment of the present invention is not limited thereto.

The back passivation film 40 has openings 402 and 404 for electrically connecting the conductive areas 32 and 34 and the electrodes 42 and 44 to each other. The openings 402 and 404 include a first opening 402 for connecting the first conductive area 32 and the first electrode 42 to each other, and a second opening 404 for connecting the second conductive area 34 and the second electrode 44 to each other. As such, the back passivation film 40 serves to prevent the first conductive area 32 and the second conductive area 34 from being connected to the incorrect electrode (i.e. the second electrode 44 in the instance of the first conductive area 32 and the first electrode 42 in the instance of the second conductive area 34). In addition, the back passivation film 40 may be used for the passivation of the first and second conductive areas 32 and 34 and/or the barrier area 36.

The back passivation film 40 may take the form of a single layer or multiple layers including a silicon oxide, a silicon nitride, a silicon oxide nitride, a silicon carbide, amorphous silicon, or the like.

The back passivation film 40 may be disposed over a portion of the semiconductor layer 30 on which the electrodes 42 and 44 are not located. The back passivation film 40 may be thicker than the control passivation layer 20. As such, the insulation and passivation properties of the back passivation film 40 may be improved. Various other alterations are possible.

In one example, in the present embodiment, the front passivation film 24 and/or the anti-reflection film 26 and the back passivation film 40 may include no dopant in order to achieve, for example, excellent insulation and passivation properties.

The electrodes 42 and 44, arranged on the back surface of the semiconductor substrate 10, include the first electrode 42 electrically and physically connected to the firstconductive area 32 and the second electrode 44 electrically and physically connected to the second conductive area 34.

The first and second electrodes 42 and 44 may include various metal materials. In addition, the first and second electrodes 42 and 44 may have various plan shapes required in order to be connected respectively to the first conductive area 32 and the second conductive area 34 without being electrically connected to each other so as to collect carriers and transmit the same to the outside. That is, the embodiment of the present invention is not limited as to the plan shape of the first and second electrodes 42 and 44.

Hereinafter, one example of the plan shape of the first conductive area 32, the second conductive area 34, the barrier area 36, and the first and second electrodes 42 and 44 will be described in detail with reference to FIGS. 1 and 2.

Referring to FIGS. 1 and 2, in the present embodiment, the first conductive area 32 and the second conductive area 34 are elongated to form stripes and are alternately arranged in the direction crossing the longitudinal direction. The barrier area 36 may be located, as a spacer, between the first conductive area 32 and the second conductive area 34. Although not illustrated in FIGS. 1 and 2, a plurality of first conductive areas 32, which are spaced apart from one another, may be connected to one another at one edge, and a plurality of second conductive areas 34, which are spaced apart from one another, may be connected to one another at an opposite edge. However, the embodiment of the present invention is not limited thereto.

At this time, the first conductive area 32 may be wider than the second conductive area 34. In one example, the areas of the first conductive area 32 and the second conductive area 34 may be adjusted by providing the first and second conductive areas 32 and 34 with different widths. That is, the width W1 of the first conductive area 32 may be greater than the width W2 of the second conductive area 34.

In addition, the first electrode 42 may have a stripe shape so as to correspond to the first conductive area 32, and the second electrode 44 may have a stripe shape so as to correspond to the second conductive area 34. Various other alterations are possible. In addition, although not illustrated in FIGS. 1 and 2, a plurality of first electrodes 42 may be connected to one another at one edge, and a plurality of second electrodes 44 may be connected to one another at an opposite edge. However, the embodiment of the present invention is not limited thereto.

Referring again to FIG. 1, the front passivation film 24 and/or the anti-reflection film 26 may be disposed over the front surface of the semiconductor substrate 10 (for example, over the front field area 130 formed on the front surface of the semiconductor substrate 10). In some embodiments, only the front passivation film 24 may be formed over the semiconductor substrate 10, only the anti-reflection film 26 may be formed over the semiconductor substrate 10, or the front passivation film 24 and the anti-reflection film 26 may be disposed in sequence over the semiconductor substrate 10. FIG. 1 illustrates that the front passivation film 24 and the anti-reflection film 26 are formed in sequence over the semiconductor substrate 10 such that the semiconductor substrate 10 comes into contact with the front passivation film 24. However, the embodiment of the present invention is not limited thereto and the semiconductor substrate 10 may come into contact with the anti-reflection film 26. Various other alterations are possible.

The front passivation film 24 and the anti-reflection film 26 may be formed substantially on the entire front surface of the semiconductor substrate 10. Here, the expression "the film formed on the entire substrate" includes not only the instance where the film is physically completely formed on the entire substrate, but also the instance where the film is inevitably formed on all except for a small portion of the substrate.

The front passivation film 24 comes into contact with the front surface of the semiconductor substrate 10 for passivation of defects present in the front surface or the bulk of the semiconductor substrate 10. As such, it is possible to increase the open-circuit voltage of the solar cell 100 by removing recombination sites of minority carriers. The anti-reflection film 26 reduces the reflectance of light introduced into the front surface of the semiconductor substrate 10. This may increase the quantity of light, which reaches the pn junction formed at the interface of the base area 110 and the first conductive area 32. Thereby, the short-circuit current Isc of the solar cell 100 may be increased. In conclusion, the front passivation film 24 and the anti-reflection film 26 may increase the open-circuit voltage and the short-circuit current of the solar cell 100, thereby improving the efficiency of the solar cell 100.

The front passivation film 24 and/or the anti-reflection film 26 may be formed of various materials. In one example, the front passivation film 24 and/or the anti-reflection film 26 may be a single-layered film or a multi-layered film having the form of a combination of two or more layers selected from among the group of a silicon nitride layer, a silicon nitride layer containing hydrogen, a silicon oxide layer, a silicon oxide nitride layer, an aluminum oxide layer, a silicon carbide layer, $MgF_2$, ZnS, $TiO_2$ and $CeO_2$. In one example, the front passivation film 24 may take the form of a silicon oxide layer formed on the semiconductor substrate 10, and the anti-reflection film 26 may take the form of a stack in which a silicon nitride layer and a silicon carbide layer are stacked one above another in sequence.

When light is introduced into the solar cell 100 in accordance with the present embodiment, holes and electrons are generated via photoelectric conversion at the pn junction formed between the base area 110 and the first conductive area 32. The generated holes and electrons move to the first conductive area 32 and the second conductive area 34 by passing through the control passivation layer 20, and thereafter move to the first and second electrodes 42 and 44. This results in the generation of electricity.

In the back contact type solar cell 100 in accordance with the present embodiment in which the electrodes 42 and 44 are formed on the back surface of the semiconductor substrate 10 and no electrodes are formed on the front surface of the semiconductor substrate 10, it is possible to minimize shading loss on the front surface of the semiconductor substrate 10. This may improve the efficiency of the solar cell 100. However, the embodiment of the present invention is not limited thereto.

In the present embodiment, the control passivation layer 20, which is a protective film disposed over the semiconductor substrate 10, is formed so as to have good quality. This will be described below in detail with regard to a method of manufacturing the solar cell 100 in accordance with one embodiment of the present invention with reference to FIGS. 3A to 3F. A detailed description related to the elements described above will be omitted, and only elements not described above will be described below in detail.

FIGS. 3A to 3F are sectional views illustrating a method of manufacturing the solar cell in accordance with one embodiment of the present invention.

Figure 3A:
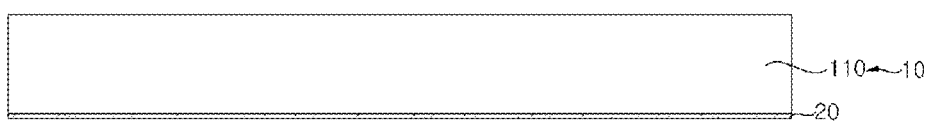
FIGS. 3A to 3F are sectional views illustrating the method of manufacturing the solar cell in accordance with one embodiment of the present invention.

First, as illustrated by example in FIG. 3A, the control passivation layer 20, which is a protective film, is formed over the back surface of the semiconductor substrate 10, which includes the base area 110 containing a second conductive dopant. In the present embodiment, the control passivation layer 20 is formed via a method including a heat treatment process, which is performed at a relatively high temperature under an atmosphere including halogen gas, which has a halogen element.

Figure 4:
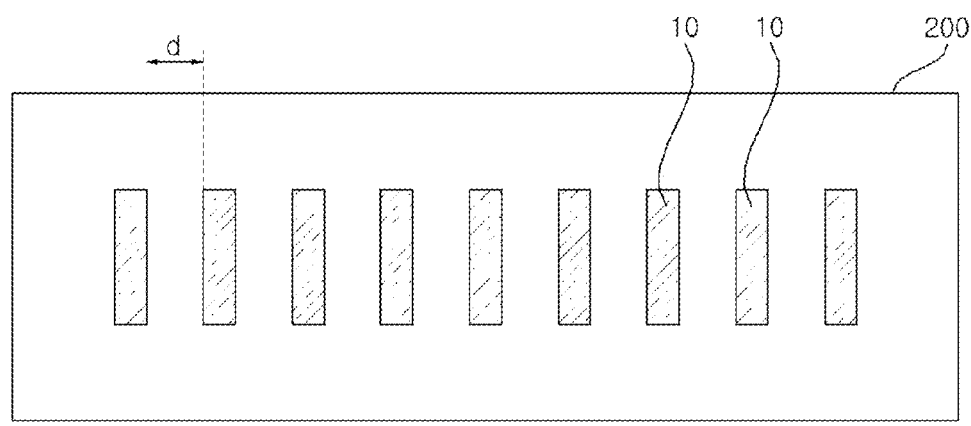
FIG. 4 is a view illustrating one example of a heat treatment device, which may perform a heat treatment process in the method of manufacturing the solar cell in accordance with one embodiment of the present invention.
Figure 5:
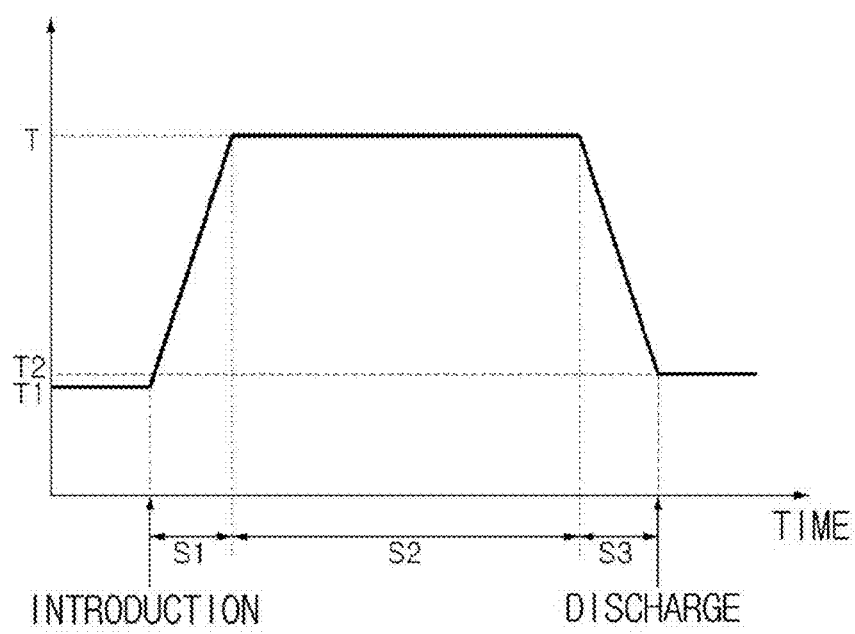
FIG. 5 is a view illustrating the temperature cycle of the heat treatment process in the method of manufacturing the solar cell in accordance with one embodiment of the present invention.

This will be described below in more detail with reference to FIGS. 4 and 5 in conjunction with FIG. 3A. FIG. 4 illustrates one example of a heat treatment device, which may perform a heat treatment process in the method of manufacturing the solar cell in accordance with one embodiment of the present invention. FIG. 5 is a view illustrating the temperature cycle of the heat treatment process in the method of manufacturing the solar cell in accordance with one embodiment of the present invention.

In the present embodiment, the control passivation layer 20 may be formed by arranging a plurality of semiconductor substrates 10 in a heat treatment device 200, and thereafter performing a heat treatment process on all of the semiconductor substrates 10. At this time, the semiconductor substrates 10 may be arranged parallel to one another and spaced apart at a predetermined distance d in the heat treatment device 200 so as to ensure the implementation of sufficient thermal oxidation in the heat treatment process. In one example, the distance d between the semiconductor substrates 10 may be within a range from 1 mm to 5 mm. When the distance d between the semiconductor substrates 10 is below 1 mm, the control passivation layer 20 may not be evenly formed due to, for example, stagnation in the flow of gas. When the distance d between the semiconductor substrates 10 exceeds 5 mm, the number of semiconductor substrates 10 that may be processed via a single heat treatment process is not great, which may deteriorate productivity. However, the embodiment of the present invention is not limited thereto, and the distance d between the semiconductor substrates 10 may be adjusted so as to have various values.

In one example, the control passivation layer 20 may be formed via a method including a heat treatment process, which is performed in the heat treatment device 200 at a heat treatment temperature T of 600 degrees Celsius or more (for example, within a range from 600 degrees Celsius to 900 degrees Celsius) under an atmosphere including halogen gas and source gas. Here, the heat treatment temperature may mean a temperature that is continuously maintained for a given time in order to form the control passivation layer 20 after the semiconductor substrate 10 is introduced into the heat treatment device 200. In addition, the introduction temperature T1 when the semiconductor substrate 10 is introduced into the heat treatment device 200 and the discharge temperature T2 when the semiconductor substrate 10, on which the control passivation layer 20 has been formed, is discharged from the heat treatment device 200 may differ from the heat treatment temperature T. Also, reference to a halogen gas also includes one or more gases in the halogen group.

For example, the semiconductor substrate 10 is introduced into the heat treatment device 200 at the introduction temperature T1, and an increase in temperature from the introduction temperature T1 to the heat treatment temperature T occurs during a temperature increase section S1. Then, heat treatment is performed at the heat treatment temperature T during a main section S2. Then, a reduction in temperature from the heat treatment temperature T to the discharge temperature T2 occurs during a temperature reduction section S3, and the semiconductor substrate 10 is discharged from the heat treatment device 200 at the discharge temperature T2. As described above, when the introduction temperature T1 and the discharge temperature T2 are lower than the heat treatment temperature T, deterioration in the quality of the semiconductor layer 10 and the control passivation layer 20 attributable to rapid variation in temperature may be prevented or reduced.

When the heat treatment process using halogen gas is performed at the heat treatment temperature T, which is relatively high (i.e. 600 degrees Celsius or more), during the main section S2, the purity of the control passivation layer 20 may be increased and the density of the control passivation layer 20 may be increased owing to a reduction in interface trap density (DIT) because the halogen gas adsorbs dopant particles during the heat treatment process. In this way, the quality of the control passivation layer 20 formed by the heat treatment process may be improved.

The adsorption of dopant particles in the halogen gas described above may be remarkable at a heat treatment temperature T of 600 degrees Celsius or more, and may not be substantially evident at a heat treatment temperature below 600 degrees Celsius. In addition, the halogen gas may remain, rather than being decomposed, at a temperature below 600 degrees Celsius, which may cause the problematic leakage of toxic halogen gas after the heat treatment process. In addition, when the heat treatment temperature T exceeds 900 degrees Celsius during the formation of the control passivation layer 20, the high heat treatment temperature may cause several problems, such as increased facility burden and manufacturing costs, and controlling the thickness of the control passivation layer 20 may become difficult, thus causing increased unevenness of the thickness of the control passivation layer 20. At this time, the heat treatment temperature T may be 650 degrees Celsius or more in order to improve the adsorption of dopant particles in the halogen gas and to improve process stability. In addition, the heat treatment temperature T may be 850 degrees Celsius or less, so as to reduce the burden associated with a high-temperature process.

In the present embodiment, the introduction temperature T1 may be 550 degrees Celsius or less (for example, within a range from 400 degrees Celsius to 550 degrees Celsius, and for example, within a range from 500 degrees Celsius to 550 degrees Celsius). When the introduction temperature T1 is below 400 degrees Celsius, the processing time of the temperature increase section S1 may increase, or the quality of the semiconductor substrate 10 may be deteriorated by the rapid increase in temperature. On the other hand, when the introduction temperature T1 exceeds 550 degrees Celsius, it may be difficult to control the thickness of the control passivation layer 20 because the control passivation layer 20 may be formed on the semiconductor substrate 10 even while the semiconductor substrate 10 is introduced into the heat treatment device 200. The introduction temperature T1 may be within a range from 500 degrees Celsius to 550 degrees Celsius when further considering the processing time.

In addition, the discharge temperature T2 may be 550 degrees Celsius or less (for example, within a range from 400 degrees Celsius to 550 degrees Celsius, for example, within a range from 500 degrees Celsius to 550 degrees Celsius). When the discharge temperature T2 is below 400 degrees Celsius, the processing time of the temperature reduction section S3 may be increased. In addition, when the discharge temperature T2 exceeds 550 degrees Celsius, problems, such as quality deterioration, may occur due to the great variation in temperature after the semiconductor substrate 10 and the control passivation layer 20 are discharged from the heat treatment device 200. The discharge temperature T2 may be within a range from 500 degrees Celsius to 550 degrees Celsius when further considering the processing time.

However, the embodiment of the present invention is not limited thereto, and the introduction temperature T1 and the discharge temperature T2 may differ from each other.

The halogen element included in the halogen gas used during the main section S2 may include at least one of fluorine, chlorine, bromine, iodine, astatine, and ununseptium. This is because halogen elements have good ability to adsorb dopant in the process of forming the control passivation layer 20, as described above. In particular, the halogen gas may include chlorine as the halogen element. The halogen gas including chlorine is readily available and exhibits considerably excellent reactive power and relatively high safety in use, and various equipment capable of using halogen gas has been developed. In one example, halogen gas including chlorine may include at least one of $Cl_2$, $C_2H_2Cl_2$, and HCl, and more particularly, may include at least one of $Cl_2$ and $C_2H_2Cl_2$. On the other hand, halogen gas including fluorine may have an etching property, and thus the use thereof may be limited. In addition, halogen gas including bromine, iodine, astatine, or ununseptium may be difficult to purchase, and iodine, astatine and ununseptium entail the risk of emitting radioactivity under specific conditions.

At this time, the quantity of halogen gas may be equal to or less than the quantity of oxygen gas because halogen gas may increase the growth rate of the control passivation layer 20. In one example, the volume ratio of oxygen gas to halogen gas may be within a range from 1:0.01 to 1:1. When the ratio is below 1:0.01, the improvement in purity attributable to chlorine gas may be not sufficient. When the ratio exceeds 1:1, a greater quantity of chlorine gas than the required quantity is included, which may deteriorate the purity of the control passivation layer 20 and increase the growth rate of the control passivation layer 20, thus increasing the thickness of the control passivation layer 20. However, the embodiment of the present invention is not limited thereto, and various alterations are possible.

In the present embodiment, the gas atmosphere in the heat treatment process may include a source gas, in addition to the halogen gas. Hence, the control passivation layer 20 may be formed via thermal oxidation in the heat treatment process, which is performed at a high temperature. Thereby, the control passivation layer 20 may be formed only through the heat treatment process without an additional process, which may simplify the overall manufacturing process. In the present embodiment, the source gas may include oxygen gas such that the control passivation layer 20 is an oxide layer. That is, the control passivation layer 20 may be a thermal oxide layer (e.g. a thermal silicon oxide layer), which is formed via the reaction of oxygen and a semiconductor material (e.g. silicon) of the semiconductor substrate 10 at a high temperature.

In addition, the gas atmosphere in the heat treatment process may include various kinds of gas, in addition to oxygen gas, which is the source gas. For example, the gas atmosphere may further include nitrogen gas. Nitrogen gas is involved in the adjustment of the growth rate of the control passivation layer 20 and is also involved in the adjustment of the uniformity of the control passivation layer 20, which is associated with a leakage current and dopant penetration. The quantity of nitrogen gas may be adjusted in consideration of the size of a chamber in which the control passivation layer 20 is formed. The total quantity of halogen gas, oxygen gas and nitrogen gas may be adjusted so as to achieve a required pressure.

In the present embodiment, the heat treatment device 200, which performs the heat treatment process, may be a typical heat treatment furnace, the pressure of which is difficult to adjust, may be a chemical vapor deposition (CVD) device, or may be a low-pressure chemical vapor deposition (LPCVD) device that may have a pressure adjustment function, and thus may perform the heat treatment process at a lower pressure than a normal pressure.

When the control passivation layer 20, which is a protective film, is formed via thermal oxidation by performing the heat treatment process in the typical heat treatment furnace, the control passivation layer 20 may be easily grown within a short time, which may reduce the processing time.

A CVD device or an LPCVD device may be suitable for maintaining desired process conditions. In one example, when the control passivation layer 20, which is a protective film, is formed via deposition by performing the heat treatment process in the LPCVD device, the heat treatment process may be performed at a pressure lower than the normal pressure, which enables the thickness of the control passivation layer 20 to be easily adjusted. Thereby, the control passivation layer 20 may be evenly formed. Here, the pressure may mean the pressure of all gases including the source gas and other gases, i.e. the pressure in the manufacture device of the control passivation layer 20.

At this time, even when the CVD device or the LPCVD device is used, the source gas does not include all source materials constituting the control passivation layer 20, but includes only oxygen gas among oxides constituting the control passivation layer 20. That is, the source gas does not include the other source materials. For example, when the control passivation layer 20 is a silicon oxide layer, the source gas includes only oxygen gas, and does not include any other gas including silicon that is a source material. Thereby, the control passivation layer 20 is formed via thermal oxidation in which oxygen of the oxygen gas is diffused into the semiconductor substrate 10 so as to react with a semiconductor material. Unlike this, for example, in a deposition process, both oxygen gas including oxygen and asilane (SiH4) gas including silicon are supplied as a source gas. Thereby, a silicon oxide is formed when oxygen and silicon, which are separated from oxygen gas and silane gas respectively via thermal decomposition, chemically react with each other.

When the control passivation layer 20 is formed via thermal oxidation at the high temperature as described above, the thickness of the control passivation layer 20 may be easily increased. When the control passivation layer 20 is formed at a pressure that is equal to or less than atmospheric pressure in the CVD device or the LPCVD device, a rapid increase in the thickness of the control passivation layer 20 may be prevented or reduced (i.e. the growth rate of the control passivation layer 20 may be controlled), which may allow the entire control passivation layer 20 to be evenly and thinly formed.

At this time, when the pressure in the heat treatment device 200 is maintained at 760 Torr or less (i.e. the pressure equal to or less than the atmospheric pressure), even if the control passivation layer 20 is formed via thermal oxidation at the relatively high temperature, the growth rate of the control passivation layer 20 may be maintained at a given level owing to the low pressure. In this way, the thickness of the control passivation layer 20 may be considerably reduced.

For example, the pressure may be within a range from 1 Torr to 760 Torr (for example, within a range from 100 Torr to 760 Torr). When the pressure at which the control passivation layer 20 is formed is below 1 Torr, for example, great cost is required to maintain the pressure and a strain may be imposed on the manufacture device of the control passivation layer 20. Giving greater consideration to the growth rate, cost, and the like, the pressure at which the control passivation layer 20 is formed may be within a range from 1 Torr to 700 Torr, and more particularly, within a range from 1 Torr to 600 Torr, for example, within a range from 100 Torr to 600 Torr. However, the embodiment of the present invention is not limited thereto, and the pressure at which the control passivation layer 20 is formed may be changed.

On the other hand, for example, the existing semiconductor field does not require a thin oxide layer, which ensures the passage of carriers, like the control passivation layer of the solar cell. That is, in the semiconductor field, the thickness of an oxide layer is adjusted within the range in which carriers do not pass through the oxide layer, but it is not necessary to form the oxide layer to a thickness through which carriers pass. In addition, because, for example, the purity of the control passivation layer has no great effect on the properties of semiconductor elements or the like, it has been difficult to propose a method of increasing the purity of the control passivation layer.

However, as described above, in the present embodiment, for example, the purity, density and thickness of the control passivation layer 20 may be adjusted when the control passivation layer 20 is formed via a method including a heat treatment process, which is performed at a high heat treatment temperature T under a gas atmosphere including halogen gas (more particularly, thermal oxidation performed during the heat treatment process).

At this time, when thermal oxidation is performed at or below the atmospheric pressure in the CVD device or the LPCVD device, the growth rate of the control passivation layer 20 may be adjusted, thus enabling the formation of a thin and even control passivation layer 20. In addition, in some embodiments, because a semiconductor layer (see reference numeral 300 in FIG. 3B), which is formed over the control passivation layer 20, is formed by a deposition equipment, when the control passivation layer 20 is formed in the deposition equipment, the control passivation layer 20 and the semiconductor layer 300 may be formed via in-situ processes, which are successively formed in the same deposition equipment (e.g. the LPCVD device). When the control passivation layer 20 and the semiconductor layer 300 are formed via the in-situ processes as described above, the manufacturing process may be significantly simplified, which may significantly reduce, for example, manufacturing costs and manufacturing time.

The interior temperature of the deposition equipment may be adjusted by applying heat or removing heat for a long time and a long time is required to stabilize the temperature. On the other hand, the gas atmosphere and the pressure may be adjusted by varying, for example, the kind and quantity of gas to be supplied into the deposition equipment. Accordingly, the gas atmosphere and the pressure may be more easily controlled than the temperature.

In consideration of this, in the present embodiment, the difference between the temperature at which the control passivation layer 20 is formed and the temperature at which the semiconductor layer 300 is deposited may be within 200 degrees Celsius (i.e. within a range from 0 degrees Celsius to 200 degrees Celsius). For example, the difference between the temperature at which the control passivation layer 20 is formed and the temperature at which the semiconductor layer 300 is deposited may be within 100 degrees Celsius (i.e. within a range from 0 degrees Celsius to 100 degrees Celsius). This is because the control passivation layer 20 is formed at or below atmospheric pressure, and therefore, the temperature at which the control passivation layer 20 is formed may be increased so as to reduce the difference from the temperature at which the semiconductor layer 300 is deposited. Owing to the fact that the temperature, which is relatively difficult to adjust, may be maintained without large change as described above, the efficiency of the in-situ processes in which the control passivation layer 20 and the semiconductor layer 300 are successively formed may be further increased. On the other hand, the gas atmosphere under which the semiconductor layer 300 is deposited may differ from the gas atmosphere under which the control passivation layer 20 is formed, and the pressure at which the semiconductor layer 300 is deposited may be the same as or different from the pressure at which the control passivation layer 20 is formed.

However, the embodiment of the present invention is not limited thereto, and the control passivation layer 20 and the semiconductor layer 300 may be formed via, for example, separate processes and devices.

Although the drawings illustrate that the control passivation layer 20 is formed only on the back surface of the semiconductor substrate 10, the embodiment of the present invention is not limited thereto. The control passivation layer 20 may be additionally formed on the front surface and/or the side surface of the semiconductor substrate 10 depending on the manufacturing method of the control passivation layer 20. The control passivation layer 20, which is formed on, for example, the front surface of the semiconductor substrate 10, may be removed later in a separate operation.

In addition, although the temperature cycle of FIG. 5 illustrates the instance where the heat treatment process of forming the protective film is performed alone, the embodiment of the present invention is not limited thereto. Accordingly, as mentioned above, after the control passivation layer 20, which is a protective film, is formed, the control passivation layer 20 may be subjected to any subsequent process (e.g. a process of forming the semiconductor layer 300) without being discharged from the heat treatment device 200. In this instance, the temperature reduction section S3 may not be performed depending on the temperature of the subsequent process. Alternatively, the heat treatment process may be successively performed in a device in which a preceding process before the formation of the protective film has been performed. In this instance, the temperature increase section S1 may not be performed depending on the temperature at which the preceding process is performed.

Figure 3B:
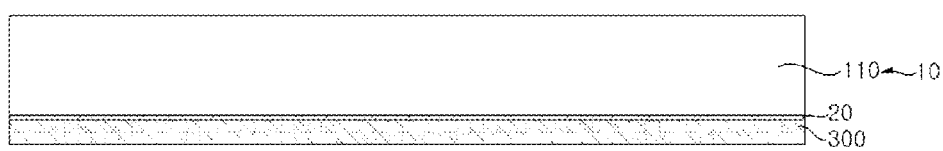
Figure 3C:
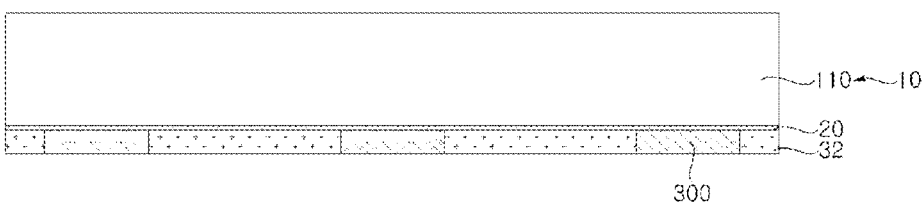
Figure 3D:
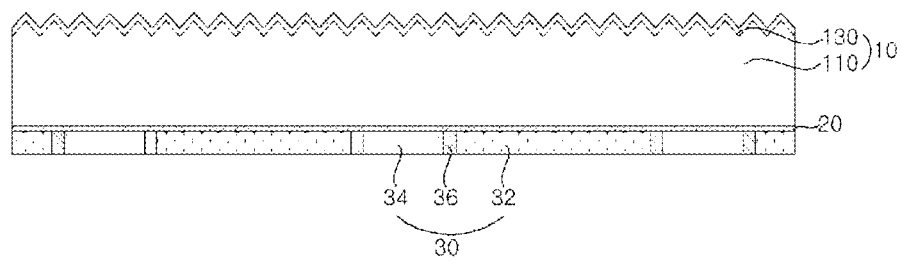

Subsequently, as illustrated in FIGS. 3B to 3D, the semiconductor layer 30, which includes the first and second conductive areas 32 and 34, may be formed on the control passivation layer 20, and the texture and the front field area 130 may be formed on the front surface of the semiconductor substrate 10. This will be described below in more detail.

First, as illustrated by example in FIG. 3B, the semiconductor layer 300, which has a crystalline structure and is formed of an intrinsic semiconductor, is formed over the control passivation layer 20, which is formed over the back surface of the semiconductor substrate 10. The semiconductor layer 300 may be formed of a microcrystalline, amorphous, or polycrystalline semiconductor. The semiconductor layer 300 may be formed via, for example, thermal growth or chemical deposition (e.g. plasma chemical vapor deposition or low-pressure chemical vapor deposition). However, the embodiment of the present invention is not limited thereto, and the semiconductor layer 300 may be formed via any of various methods.

In one example, in the present embodiment, the intrinsic semiconductor layer 300 may be formed by chemical vapor deposition, and more particularly, may be formed via low-pressure chemical vapor deposition. Accordingly, as described above, the control passivation layer 20 and the intrinsic semiconductor layer 300 may be formed via the in-situ processes. However, the embodiment of the present invention is not limited thereto, and in-situ processes may not be applied to the control passivation layer 20 and the semiconductor layer 300.

The gas used in the process of depositing the semiconductor layer 300 may include a gas (e.g. silane gas) that includes a semiconductor material constituting the semiconductor layer 300. In the present embodiment, because the intrinsic semiconductor layer 300 is deposited, a gas atmosphere may be composed only of the gas including a semiconductor material. This may simplify the supply of the gas and may increase the purity of the semiconductor layer 300 to be formed. However, the embodiment of the present invention is not limited thereto, and any other gas may be additionally used in order to facilitate the deposition of the semiconductor layer 300 or to improve the properties of the semiconductor layer 300. In addition, in the instance where doping using first dopant and/or second dopant is performed in the process of depositing the semiconductor layer 300, a gas including the first or second conductive dopant (e.g. $B_2H_6$ or $PH_3$) may be additionally used.

In addition to the gas including the semiconductor material, in the process of depositing the semiconductor layer 300, nitrogen dioxide ($N_2O$) gas and/or oxygen ($O_2$) gas are introduced in order to adjust, for example, the size of crystal grains and crystallinity.

The temperature at which the semiconductor layer 300 is deposited may be equal to or less than the temperature at which the control passivation layer 20 is formed. In particular, when the temperature at which the semiconductor layer 300 is deposited is less than the temperature at which the control passivation layer 20 is formed, the semiconductor layer 300, which is directly involved in photoelectric conversion, may achieve uniform properties. Alternatively, the temperature at which the semiconductor layer 300 is deposited may be within a range from 500 degrees Celsius to 700 degrees Celsius. This is limited to a temperature suitable for the deposition of the semiconductor layer 300, which has a different crystalline structure from that of the semiconductor substrate 10. In particular, in the instance where the semiconductor layer 300 is not doped as in the present embodiment, the temperature at which the semiconductor layer 300 is deposited may be within a range from 600 degrees Celsius to 700 degrees Celsius because the semiconductor layer 300 has a lower reaction rate than a doped semiconductor layer. In this way, it is possible to further reduce the difference between the temperature at which the semiconductor layer 300 is deposited and the temperature at which the control passivation layer 20 is formed.

As described above, because the temperature at which the control passivation layer 20 is formed is the same as or similar to the temperature at which the semiconductor layer 300 is deposited, for example, the time required to adjust the temperature or the time required to stabilize the temperature is not required, which may simplify the process.

Although FIG. 3B illustrates that the semiconductor layer 300 is formed only on the back surface of the semiconductor substrate 10, the embodiment of the present invention is not limited thereto. The semiconductor layer 300 may be additionally formed on the front surface and/or the side surface of the semiconductor substrate 10 according to the manufacturing method of the semiconductor layer 300. The semiconductor layer 300 formed on, for example, the front surface of the semiconductor substrate 10 will be removed later in a separate operation.

Subsequently, as illustrated by example in FIGS. 3C and 3D, the front surface of the semiconductor substrate 10 may be subjected to texturing so that protrusions are formed on the front surface of the semiconductor substrate 10, and the first and second conductive areas 32 and 34 and the front field area 130 may be formed.

In one example, as illustrated by example in FIG. 3C, a portion of the semiconductor layer 300 may be doped with a first conductive dopant so as to form the first conductive area 32 and then, as illustrated by example in FIG. 3D, the front surface of the semiconductor substrate 10 is subjected to texturing and the front surface of the semiconductor substrate 10 and another portion of the semiconductor layer 300 may be doped with a second conductive dopant so as to form the front field area 130 and the second conductive area 34. At this time, an undoped area, which is not doped with a dopant, may be located between the first conductive area 32 and the second conductive area 34, and this area may be the barrier area 36.

Various known methods may be used in the doping process of forming the first and second conductive areas 32 and 34 and the front field area 130. In one example, various methods, such as ion implantation, thermal diffusion, which is heat treatment using gas including a dopant, heat treatment performed after the formation of a doped layer, or laser doping, may be applied. The embodiment of the present invention is not limited thereto.

The texturing performed on the surface of the semiconductor substrate 10 may be wet or dry texturing. Wet texturing may be performed by dipping the semiconductor substrate 10 into a texturing solution, and has the advantage of a short processing time. Dry texturing is the process of grinding the surface of the semiconductor substrate 10 using, for example, a diamond grill or laser, and may entail the disadvantages of a long processing time and the potential for damage to the semiconductor substrate 10, although it may be advantageous in that protrusions are formed evenly. In addition, the texturing on the semiconductor substrate 10 may be, for example, Reactive Ion Etching (RIE). As such, in the present invention, the semiconductor substrate 10 may be subjected to texturing via various methods.

The present embodiment illustrates that, after the semiconductor layer 300 and the first conductive area 32 formed in sequence, the front surface of the semiconductor substrate 10 is subjected to texturing, after which the front field area 130 and the second conductive area 34 are formed in the same doping process. However, the embodiment of the present invention is not limited thereto. Accordingly, the sequence of forming the first conductive area 32, the second conductive area 34, the front field area 130, and the texture may be altered in various ways. In addition, the second conductive area 34 and the front field area 130 may be formed via different doping processes.

Figure 3E:
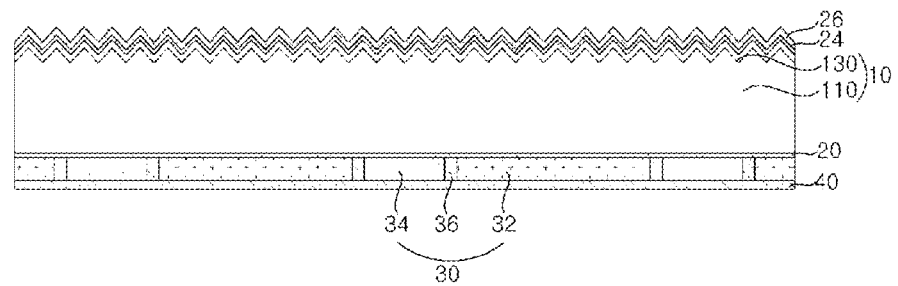

Subsequently, as illustrated by example in FIG. 3E, other protective films are formed on the front surface and the back surface of the semiconductor substrate 10. That is, the front passivation film 24 and the anti-reflection film 26 are formed on the front surface of the semiconductor substrate 10, and the back passivation film 40 is formed on the back surface of the semiconductor substrate 10.

For example, the front passivation film 24 and the anti-reflection film 26 are formed over the entire front surface of the semiconductor substrate 10, and the back passivation film 40 is formed over the entire back surface of the semiconductor substrate 10. The front passivation film 24, the anti-reflection film 26, or the back passivation film 40 may be formed via any of various methods such as, for example, vacuum deposition, chemical vapor deposition, spin coating, screen printing, or spray coating. The sequence of forming the front passivation film 24, the anti-reflection film 26, and the back passivation film 40 is not limited.

Figure 3F:
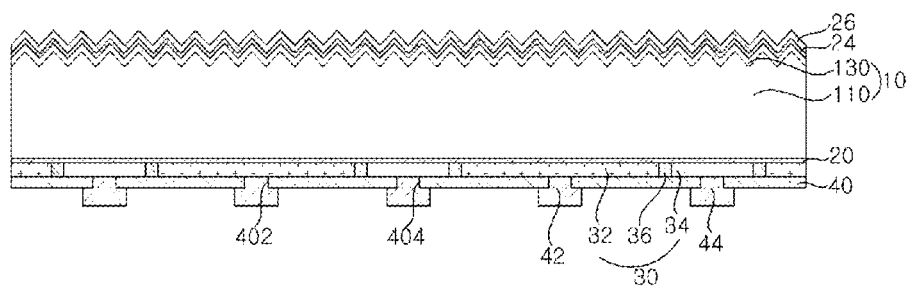

Subsequently, as illustrated by example in FIG. 3F, the first and second electrodes 42 and 44, which are connected respectively to the first and second conductive areas 32 and 34, are formed.

In one example, the first and second openings 402 and 404 are formed in the back passivation film 40 via a patterning process, and thereafter, are filled with the first and second electrodes 42 and 44. At this time, the first and second openings 402 and 404 may be formed via any of various methods, such as laser ablation using a laser, or etching using an etching solution or etching paste. In addition, the first and second electrodes 42 and 44 may be formed via any of various methods, such as plating or deposition.

In another example, after a paste for the formation of the first and second electrodes 42 and 44 may be applied on the back passivation film 40 via screen printing or the like, for example, fire-through phenomenon or laser firing contact may be used in order to form the first and second electrodes 42 and 44 having the above-described shape. In this instance, because the first and second openings 402 and 404 are formed when the first and second electrodes 42 and 44 are formed, no process of forming the first and second openings 402 and 404 is added.

In the present embodiment, the control passivation layer 20 may be formed via a heat treatment process, which is performed at a heat treatment temperature within a range from 600 degrees Celsius to 900 degrees Celsius under a gas atmosphere including halogen gas, which may increase the purity and density of the control passivation layer 20 and reduce the interface trap density. Thereby, the passivation of the control passivation layer 20 may be improved, and the efficiency of the solar cell 100 may be increased owing to the smooth passage of carriers. In addition, the control passivation layer 20 may continuously maintain good quality and properties during a subsequent high-temperature process. This may further increase the efficiency of the solar cell 100 because the temperature of a subsequent high-temperature process (e.g. a doping process) may be freely selected. In some embodiments, in the instance where the control passivation layer 20 is formed at a temperature similar to the temperature at which the semiconductor layer 300 will be deposited after the formation of the control passivation layer 20, the control passivation layer 20 and the semiconductor layer 30 may be formed in successive processes, which may simplify the manufacturing process.

An alternative embodiment of the method of manufacturing the solar cell 100 in accordance with one embodiment described above will be described below with reference to FIGS. 6A and 6B. A detailed description related to parts that are the same or similar to those of the embodiments with reference to FIGS. 3A to 3F and FIGS. 4 and 5 will be omitted below and the following description will be focused on description of parts that are different. In addition, combinations of the above-described embodiment or alterations thereof with the following embodiment or alterations thereof fall within the scope of the present invention.

Figure 6A:
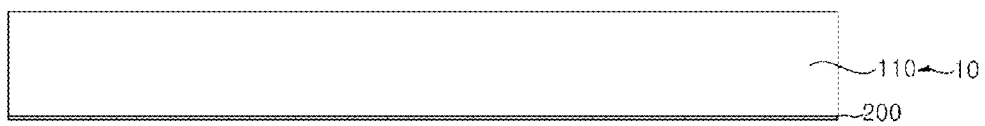
FIGS. 6A and 6B are sectional views illustrating an operation of forming a control passivation layer in the method of manufacturing the solar cell in accordance with one embodiment of the present invention.
Figure 6B:

FIGS. 6A and 6B are sectional views illustrating an operation of forming the control passivation layer in the method of manufacturing the solar cell in accordance with an alternative embodiment of the present invention.

Referring to FIGS. 6A and 6B, in the present alternative embodiment, the control passivation layer 20, which is a protective film formed over the semiconductor substrate 10, may be a protective film formed by performing a heat treatment process after a preliminary protective film 200 is formed.

That is, as illustrated by example in FIG. 6A, the preliminary protective film 200 is formed over the semiconductor substrate 10. The preliminary protective film 200 may be formed using any of various processes, which is performed at a temperature equal to or less than the temperature of the heat treatment process (i.e. a temperature of 600 degrees Celsius or less). When the preliminary protective film 200 is formed at a lower temperature than the heat treatment process, it is possible to prevent the addition of any high-temperature process, which may reduce a process burden.

In one example, the preliminary protective film 200 may be formed via a wet chemical process using a wet chemical solution. In the wet chemical process, the preliminary protective film 200, which has a smaller thickness and/or lower density than those of the control passivation layer 20, is formed on the surface of the semiconductor substrate 10 via the application or positioning of the wet chemical solution. The wet chemical solution may be any of various solutions that may be used to form the preliminary protective film 200 on the surface of the semiconductor substrate 10 via reaction with the semiconductor substrate 10. In one example, the wet chemical solution may be hydrochloric acid (HCl), hydrogen peroxide ($H_2O_2$), or mixtures thereof. This is because the solution may easily form the preliminary protective film 20, which is formed of an oxide, on the semiconductor substrate 10 via reaction with the semiconductor substrate 10.

Alternatively, the preliminary protective film 200 may be formed via, for example, a dry process (e.g. deposition (such as chemical vapor deposition or low-pressure chemical vapor deposition)).

Subsequently, as illustrated by example in FIG. 6B, the control passivation layer 20 is formed by performing a heat treatment process on the preliminary protective film 200. Because the heat treatment process is the same as or extremely similar to the heat treatment process that was described above with reference to FIGS. 3A, 4 and 5, the description with reference to FIGS. 3A, 4 and 5 may be applied without change. However, the heat treatment process with reference to FIG. 6B may not require oxygen gas, unlike the heat treatment process described with reference to FIG. 3A, and heat treatment may be performed in the state in which oxygen gas is not provided.

As described above, in the present alternative embodiment, after the preliminary protective film 200, which has a smaller thickness and/or lower density than the control passivation layer 20, is first formed, the control passivation layer 20 is formed via the implementation of a heat treatment process. Thereby, the uniformity and density of the passivation control layer 20 may be increased. In addition, rather than additionally performing a process of forming the preliminary protective film 200 illustrated in FIG. 6A, the preliminary protective film 200 illustrated in FIG. 6A may be formed in a process of washing the semiconductor substrate 10. Thereby, the preliminary protective film 200 illustrated in FIG. 6A may be formed in a simplified manner without an additional process.

The above description and the drawings illustrate that the control passivation layer 20 is formed via the implementation of the heat treatment process after the oxide film 200 is formed. Alternatively, the heat treatment process illustrated in FIG. 6B may be replaced with another heat treatment process for the manufacture of the solar cell 100 (e.g. the process of forming the semiconductor layer 300 illustrated in FIG. 3B, the doping process illustrated in FIG. 3D or an activation heat treatment process for the same, or the electrode forming process). However, the embodiment of the present invention is not limited thereto.

The above-described embodiment illustrates that, when the first and second conductive areas 32 and 34 are separately arranged over the back surface of the semiconductor substrate 10, the control passivation layer 20, which is a protective film formed over the semiconductor substrate 10, is formed via the above-described heat treatment process. However, the embodiment of the present invention is not limited thereto. In one example, at least one of the front passivation film 24 formed over the semiconductor layer 10 and the back passivation film 40 formed over the semiconductor layer 30 (or the conductive areas 32 and 34) may be a protective film formed via the above-described heat treatment process. In addition, another example of the protective film formed via the above-described heat treatment process will be described below in detail with reference to FIGS. 7 and 8. A detailed description related to parts that are the same or similar to those of the embodiments with reference to FIGS. 3A to 3F and FIGS. 4 and 5 will be omitted below and the following description will be focused on description of parts that are different. In addition, combinations of the above-described embodiment or alterations thereof with the following embodiment or alterations thereof fall within the scope of the present invention.

Figure 7:
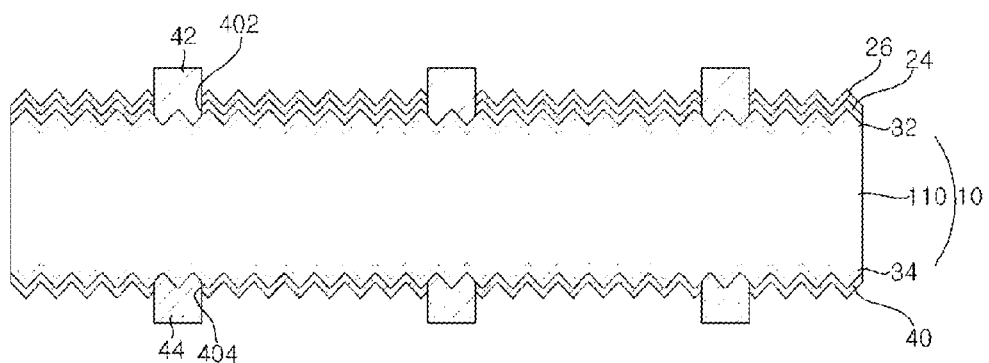
FIG. 7 is a sectional view illustrating another example of the solar cell manufactured by the method of manufacturing the solar cell in accordance with one embodiment of the present invention.
Figure 8:
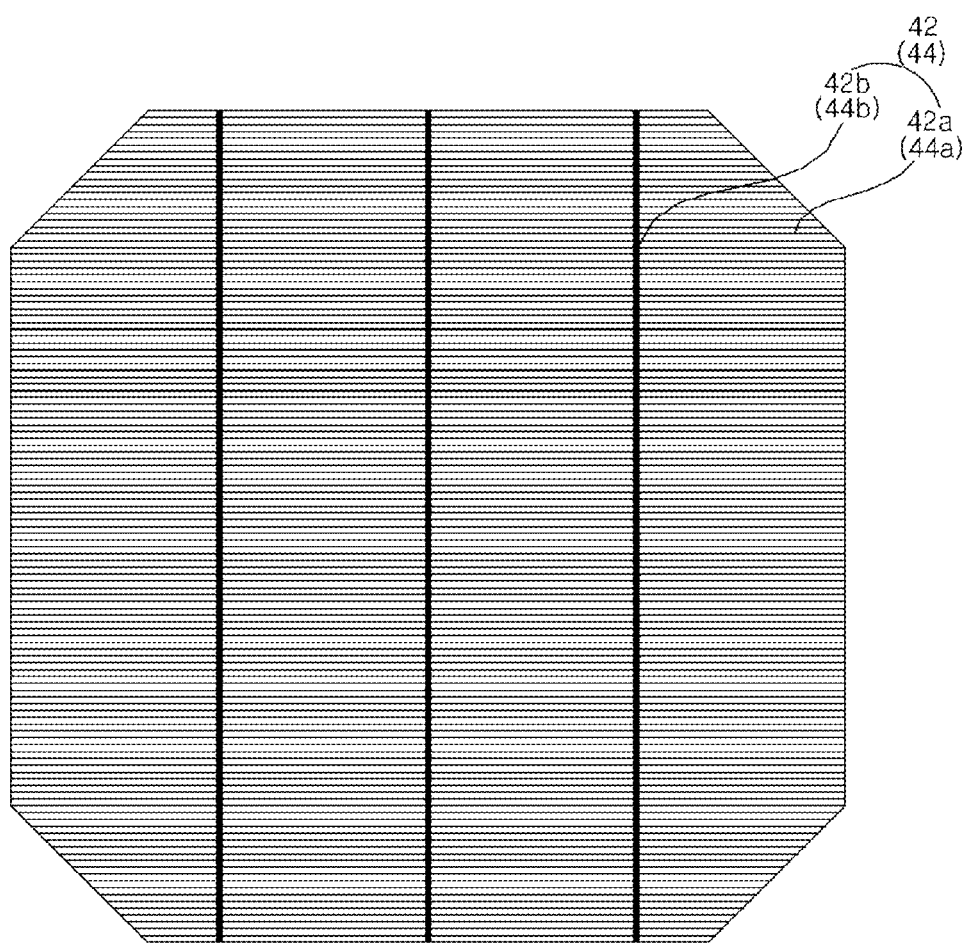
FIG. 8 is a schematic plan view of the solar cell illustrated in FIG. 7.

FIG. 7 is a sectional view illustrating another example of the solar cell manufactured by the method of manufacturing the solar cell in accordance with an embodiment of the present invention. FIG. 8 is a schematic plan view of the solar cell illustrated in FIG. 7.

Referring to FIG. 7, the solar cell 100 in accordance with the present embodiment includes the semiconductor substrate 10 including the base area 110, the conductive areas 32 and 34 formed on the semiconductor substrate 10, the front and back passivation films 24 and 40, which are protective films formed over the semiconductor substrate 10, and the electrodes 42 and 44, which penetrate the back passivation film 40 to thereby be connected to the conductive areas 32 and 34. At this time, at least one of the front and back passivation films 24 and 40, which are protective films formed over the semiconductor substrate 10, may be formed by a manufacturing method including the heat treatment process in accordance with the present embodiment.

For example, the conductive areas 32 and 34 may include the first conductive area 32, which is located on the front surface of the semiconductor substrate 10 and exhibits a first conductive type, and the second conductive area 34, which is located on the back surface of the semiconductor substrate 10 and exhibits a second conductive type. In addition, the electrodes 42 and 44 may include the first electrode 42 connected to the first conductive area 32 and the second electrode 44 connected to the second conductive area 34. In addition, protective films formed over the semiconductor substrate 10 may include the front passivation film 24, which is formed on the front surface of the semiconductor substrate 10 over the first conductive area 32, and the back passivation film 40, which is formed on the back surface of the semiconductor substrate 10 over the second conductive area 34. In addition, the protective films may further include the anti-reflection film 26 disposed on the front passivation film 24.

In the present embodiment, the conductive areas 32 and 34 are doped areas, which constitute a portion of the semiconductor substrate 10, the doped areas being formed by doping some inner areas of the semiconductor substrate 10 with dopants. The base area 110 and the conductive areas 32 and 34, which constitute the semiconductor substrate 10 as described above, may be defined based on the kinds and concentrations of dopants included therein. For example, an area of the semiconductor substrate 10 that includes a first conductive dopant and thus exhibits a first conductive type may be defined as the first conductive area 32, an area of the semiconductor substrate 10 that is doped with a second conductive dopant at a low doping concentration and thus exhibits a second conductive type may be defined as the base area 110, and an area of the semiconductor substrate 10 that is doped with the second conductive dopant at a higher doping concentration than that in the base area 110 and thus exhibits the second conductive type may be defined as the second conductive area 34. That is, the base area 110 and the conductive areas 32 and 34 are areas that have the crystalline structure of the semiconductor substrate 10 but have different conductive types and doping concentrations.

The first conductive dopant included in the first conductive area 32 may be an n-type or p-type dopant, and the second conductive dopant included in the base area 110 and the second conductive area 34 may be a p-type or n-type dopant, which is contrary to the first conductive type of the first conductive area 32. The description of the above embodiment related to the p-type or n-type dopant may be applied without change.

In one example, the first conductive area 32 may be of a p-type, and the base area 110 and the second conductive area 34 may be of an n-type. When light is emitted to the pn junction formed by the first conductive area 32 and the base area 110, electrons generated by photoelectric conversion move to the back surface of the semiconductor substrate 10 to thereby be collected by the second electrode 44, and holes move to the front surface of the semiconductor substrate 10 to thereby be collected by the first electrode 42. Thereby, electricity is generated. When holes, which move more slowly than electrons, move to the front surface of the semiconductor substrate 10, rather than the back surface, the conversion efficiency may be improved. However, the embodiment of the present invention is not limited thereto, and the base area 110 and the second conductive area 34 may be of a p-type, and the first conductive area 32 may be of an n-type.

FIG. 7 illustrates that protrusions are formed, via texturing, on the front surface and the back surface of the semiconductor substrate 10. However, the embodiment of the present invention is not limited thereto. Thus, protrusions may be formed, via texturing, on any one of the front surface and the back surface of the semiconductor substrate 10, or no protrusions may be formed, via texturing, on the front surface and the back surface of the semiconductor substrate 10.

In the present embodiment, at least one of the front passivation film 24 and the back passivation film 40, which are protective films formed respectively on the front surface and the back surface of the semiconductor substrate 10, may be a protective film formed via a method including the heat treatment process in accordance with the present embodiment. In one example, the passivation films 24 and 40, which are formed over the n-type area among the conductive areas 32 and 34, may be protective films formed via a method including the heat treatment process in accordance with the present embodiment. The protective film, formed via a method including the heat treatment process in accordance with the present embodiment is a silicon oxide layer. This is because the silicon oxide layer has a fixed positive charge, and thus is suitable for passivation. However, the embodiment of the present invention is not limited thereto.

In one example, when the second conductive area 34 is of an n-type, the back passivation film 40, which is located on (e.g. in contact with) the back surface of the semiconductor substrate 10, may be a protective film formed via a method including the heat treatment process in accordance with the present embodiment. The thickness of the back passivation film 40 may be within a range from 2 nm to 10 nm (e.g. within a range from 3 nm to 6 nm). When the thickness of the back passivation film 40 is below 2 nm, the passivation of the back passivation film 40 may be not good or sufficient. When the thickness of the back passivation film 40 exceeds 10 nm, the processing time may be increased. When further considering the passivation and the processing time, the thickness of the back passivation film 40 may be within a range from 3 nm to 6 nm. However, the embodiment of the present invention is not limited as to the thickness of the back passivation film 40.

In addition, the front passivation film 24 and/or the anti-reflection film 26 may be formed of any of various materials described in the above embodiment. A description related thereto will be omitted.

However, the embodiment of the present invention is not limited thereto, and the first conductive area 32 may be of an n-type and the front passivation film 24 may be formed via the heat treatment process in accordance with the present embodiment. Alternatively, the front passivation film 24 and/or the back passivation film 40 may be formed, via the heat treatment process in accordance with the present embodiment, regardless of the conductive type. Various other alterations are possible.

Referring to FIG. 8, the first and second electrodes 42 and 44 may include a plurality of finger electrodes 42*a* and 44*a*, which are spaced apart from one another at a constant pitch. Although FIG. 8 illustrates that the finger electrodes 42*a* and 44*a* are parallel to one another and are also parallel to the edge of the semiconductor substrate 10, the embodiment of the present invention is not limited thereto. In addition, the first and second electrodes 42 and 44 may include bus bar electrodes 42*b* and 44*b*, which are formed in the direction crossing the finger electrodes 42*a* and 44*a* so as to connect the finger electrodes 42*a* and 44*a* to one another. Only one bus bar electrode 42*b* or 44*b* may be provided, or a plurality of bus bar electrodes 42*b* or 44*b* may be arranged at a larger pitch than the pitch of the finger electrodes 42*a* and 44*a* as illustrated by example in FIG. 8. At this time, although the width of the bus bar electrodes 42*b* and 44*b* may be larger than the width of the finger electrodes 42*a* and 44*a*, the embodiment of the present invention is not limited thereto. Accordingly, the width of the bus bar electrodes 42*b* and 44*b* may be equal to or less than the width of the finger electrodes 42*a* and 44*a*.

When viewing the cross section, both the finger electrodes 42*a* and the bus bar electrodes 42*b* of the first electrode 42 may be formed so as to penetrate the front passivation film 24 and the anti-reflection film 26. That is, the first opening 402 may be formed so as to correspond to both the finger electrodes 42*a* and the bus bar electrodes 42*b* of the first electrode 42. In addition, both the finger electrodes 44*a* and the bus bar electrodes 44*b* of the second electrode 44 may be formed so as to penetrate the back passivation film 40. That is, the second opening 404 may be formed so as to correspond to both the finger electrodes 44*a* and the bus bar electrodes 44*b* of the second electrode 44. However, the embodiment of the present invention is not limited thereto. In another example, the finger electrodes 42*a* of the first electrode 42 may be formed so as to penetrate the front passivation film 24 and the anti-reflection film 26, and the bus bar electrodes 42*b* may be formed over the front passivation film 24 and the anti-reflection film 26. In addition, the finger electrodes 44*a* of the second electrode 44 may be formed so as to penetrate the back passivation film 40, and the bus bar electrodes 44*b* may be formed over the back passivation film 40.

In the present embodiment, the first and second electrodes 42 and 44 of the solar cell 100 have a given pattern so that the solar cell 100 has a bi-facial structure for allowing light to be introduced into the front surface and the back surface of the semiconductor substrate 10. Thereby, the quantity of light used in the solar cell 100 may be increased, which may contribute to the improvement of the efficiency of the solar cell 100.

Although FIG. 8 illustrates that the first electrode 42 and the second electrode 44 have the same shape. However, the embodiment of the present invention is not limited thereto, and the widths and pitches of the finger electrodes 42*a* and the bus bar electrodes 42*b* of the first electrode 42 may be different from the widths and pitches of the finger electrodes 44*a* and the bus bar electrodes 44*b* of the second electrode 44. In addition, the first electrode 42 and the second electrode 44 may have different shapes, and various other alterations are possible. For example, the second electrode 44 may be not patterned, but may be formed over the entire back surface of the semiconductor substrate 10.

A process of manufacturing the solar cell 100 having the back passivation film 40 in accordance with the present embodiment will be described below with reference to FIGS. 9A to 9D. A detailed description related to parts that are the same or similar to those of the embodiment with reference to FIGS. 3A to 3F, FIGS. 4 and 5, and FIGS. 6A and 6B will be omitted below and the following description is focused on description of parts that are different.

FIGS. 9A to 9D are sectional views illustrating the method of manufacturing the solar cell in accordance with another embodiment of the present invention.

Figure 9A:
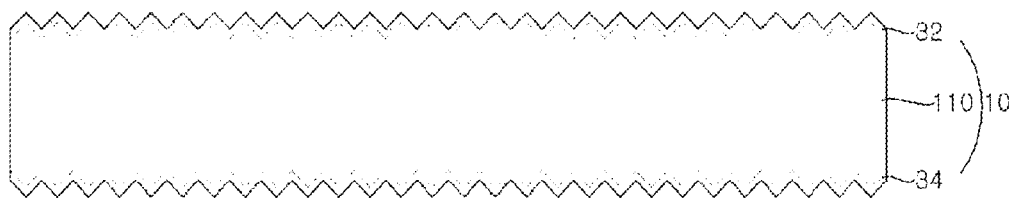
FIGS. 9A to 9D are sectional views illustrating the method of manufacturing the solar cell in accordance with another embodiment of the present invention.

As illustrated by example in FIG. 9A, the first and second conductive areas 32 and 34 are formed on the semiconductor substrate 10. The first and second conductive areas 32 and 34 may be formed via any of various methods, such as thermal diffusion, ion implantation, or laser doping.

Subsequently, as illustrated by example in FIG. 9B, the back passivation film 40 is formed over the second conductive area 34. A heat treatment process of forming the back passivation film 40 is the same as or extremely similar to the above description with reference to FIGS. 3A, 4 and 5. However, in order to provide the back passivation film 40 with a relatively great or greater thickness, for example, the heat treatment temperature or the heat treatment time may be adjusted within the above-described temperature range. That is, as described above, the heat treatment temperature may be 600 degrees Celsius or more (for example, within a range from 600 degrees Celsius to 900 degrees Celsius). In the present embodiment, for example, the heat treatment temperature may be within a range from 800 degrees Celsius to 900 degrees Celsius. This is because the back passivation film 40 may be slightly thicker than the control passivation layer (see reference numeral 20 in FIG. 1), and therefore it may be allowed to slightly increase the heat treatment temperature T. However, the embodiment of the present invention is not limited thereto.

Subsequently, as illustrated by example in FIG. 9C, the front passivation film 24 and the anti-reflection film 26 are formed over the first conductive area 32.

Figure 9B:
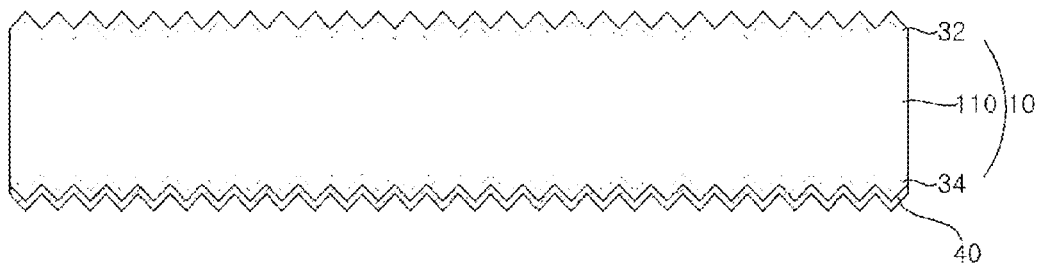
Figure 9C:
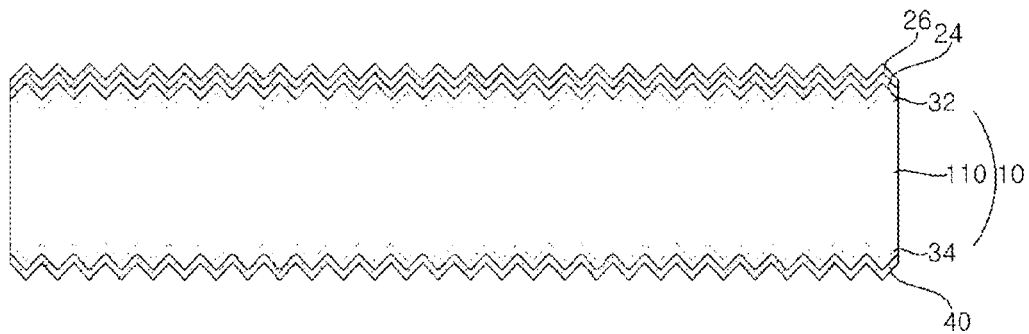

Although FIGS. 9B and 9C and the description related thereto illustrate that the back passivation film 40 is formed prior to forming the front passivation film 24 and/or the anti-reflection film 26, the embodiment of the present invention is not limited thereto. The sequence of forming back passivation film 40, the front passivation film 24, and the anti-reflection film 26 may be altered in various ways. In addition, the back passivation film 40 and the front passivation film 24 may be formed at the same time using the above-described process, or the back passivation film 40 and the anti-reflection film 26 may be formed at the same time using the above-described process.

Figure 9D:
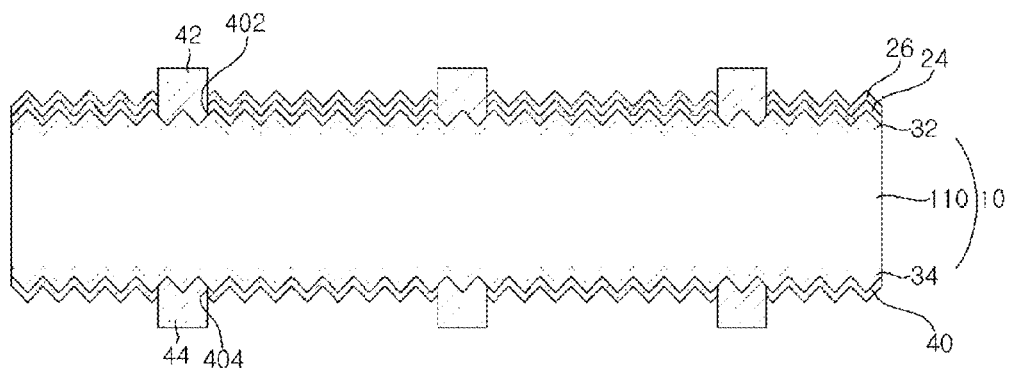

Subsequently, as illustrated by example in FIG. 9D, the second electrode 44, which penetrates the back passivation film 40, and the first electrode 42, which penetrates the front passivation film 24 and the anti-reflection film 26, are formed.

When the back passivation film 40 is formed at a given heat treatment temperature under a gas atmosphere, the purity and density of the back passivation film 40 may be increased, and the interface trap density may be reduced. In addition, the back passivation film 40 may achieve good stability even in a subsequent high-temperature process. Although the above description illustrates that only the back passivation film 40 is formed at a given temperature under a gas atmosphere, the front passivation film 24 or the anti-reflection film 26 may also be formed at the above-described heat treatment temperature T under a gas atmosphere. Another example of the protective film, which may be manufactured via the above-described heat treatment process, will be described below in detail with reference to FIGS. 10A to 10D. Because the embodiment of FIGS. 10A to 10D is the same as or similar to the embodiment described with reference to FIGS. 1 to 5, the description with reference to FIGS. 1 to 5 may be applied without change. Thus, a detailed description related to parts that are the same or similar to those of the embodiments with reference to FIGS. 1 to 5 will be omitted below and the following description will be focused on description of parts that are different. In addition, combinations of the above-described embodiment or alterations thereof with the following embodiment or alterations thereof fall within the scope of the present invention.

FIGS. 10A to 10D are sectional views illustrating the method of manufacturing the solar cell in accordance with a further embodiment of the present invention.

The present embodiment differs from the embodiment described with reference to FIGS. 3A to 3F in terms that the back passivation film 40 and/or the front passivation film 24 are formed via heat treatment under a gas atmosphere including halogen gas, although the solar cell 100 is manufactured as illustrated by example in FIGS. 1 and 2.

Figure 10A:
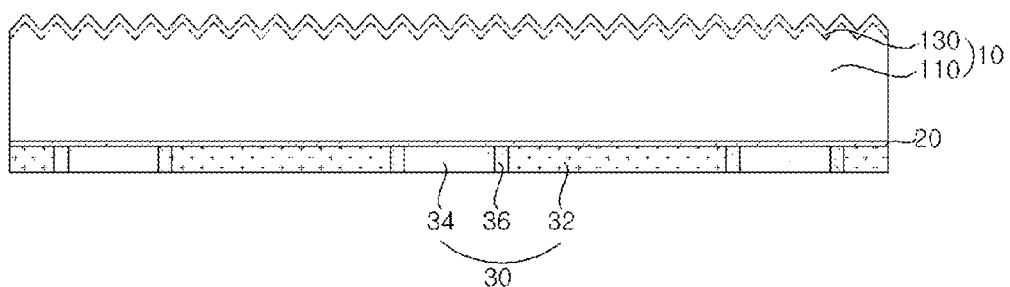
FIGS. 10A to 10D are sectional views illustrating the method of manufacturing the solar cell in accordance with a further embodiment of the present invention.

As illustrated by example in FIG. 10A, the control passivation layer 20, the semiconductor layer 30 including the first and second conductive areas 32 and 34, a texture and the front field area 130 on the front surface of the semiconductor substrate 10 are formed on the semiconductor substrate 10. The control passivation layer 20 may be formed via any of known various methods, and the other forming processes may be formed via the same method as that described above with reference to FIGS. 3A to 3D.

Figure 10B:
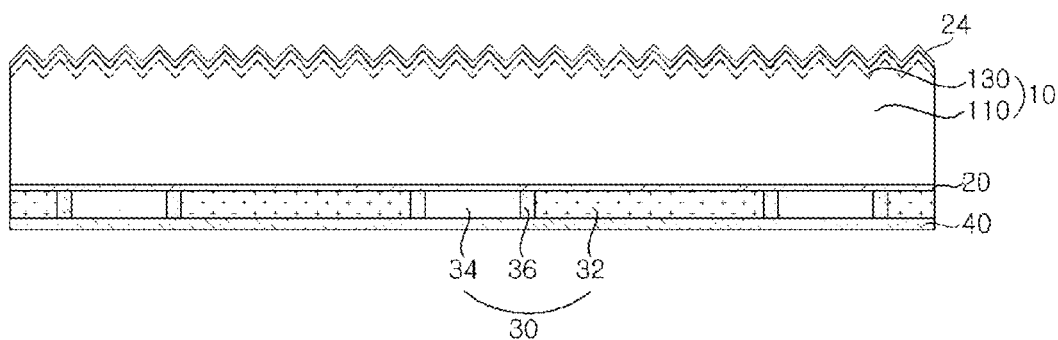

Subsequently, as illustrated by example in FIG. 10B, other protective films are formed on the front surface and/or the back surface of the semiconductor substrate 10. For example, the front passivation film 24 is formed on the front surface of the semiconductor substrate 10, and the back passivation film 40 is formed on the back surface of the semiconductor substrate 10.

In the present embodiment, the back passivation film 40 and the front passivation film 24 are formed via a method including a heat treatment process, which is performed at a relatively high temperature under a gas atmosphere including halogen gas, which has a halogen element. The heat treatment process is the same as or extremely similar to that described above with reference to FIGS. 3A, 4 and 5. However, in order to provide the front and back passivation films 24 and 40 with a relatively great or greater thickness, for example, the heat treatment temperature or the heat treatment time may be adjusted within the above-described temperature range. That is, as described above, the heat treatment temperature may be 600 degrees Celsius or more (more specifically, within a range from 600 degrees Celsius to 900 degrees Celsius). In the present embodiment, for example, the heat treatment temperature may be within a range from 800 degrees Celsius to 900 degrees Celsius. This is because the front and back passivation films 24 and 40 may be slightly thicker than the control passivation layer (see reference numeral 20 in FIG. 1), and therefore it may be allowed to slightly increase the heat treatment temperature T. However, the embodiment of the present invention is not limited thereto.

In the heat treatment process of the present embodiment, the front and back passivation films 24 and 40 may be formed via thermal oxidation. The front and back passivation films 24 and 40 may be oxide layers when a source gas includes oxygen gas. In one example, the front and back passivation films 24 and 40 may be thermal oxide (e.g. thermal silicon oxide) layers, which are formed via the reaction of oxygen and a semiconductor material (e.g. silicon) of the semiconductor substrate 10 at a high temperature.

In the present embodiment, a semiconductor material, which has a thickness within a range from 1 nm to 3 nm, may be combined with oxygen on the surface of the semiconductor layer 30, so as to form the front and back passivation films 24 and 40, each of which has a thickness within a range from 3 nm to 6 nm. When the front and back passivation films 24 and 40 have this thickness, significantly improved passivation may be achieved. That is, when the thickness of each of the front and back passivation films 24 and 40 is below 3 nm, it may be difficult to realize sufficient passivation. When the thickness of each of the front and back passivation films 24 and 40 exceeds 6 nm, the time of the heat treatment process is increased, thus causing deterioration in the properties of the semiconductor layer 30. The thickness of the semiconductor layer 300 combined with oxygen, the thickness of the front and back passivation films 24 and 40, and the like may be measured and evaluated using, for example, a transmission electronic microscope (TEM).

At this time, when the front passivation film 24, which is located close to the front surface of the semiconductor substrate 10, is formed via the above-described heat treatment process, the front passivation film 24 has good quality. Thereby, the front passivation film 24 may achieve significantly improved passivation. At this time, because the inside (bulk) of the semiconductor substrate 10 is exposed by the texture on the front surface of the semiconductor substrate 10, a greater amount of ions (e.g. sodium ions), which cause deterioration in quality, are present on the front surface than on the back surface, and thus so-called gettering effects may greatly occur on the front surface. When the front passivation film 24 has good quality, passivation effects may be significantly enhanced.

Figure 10C:
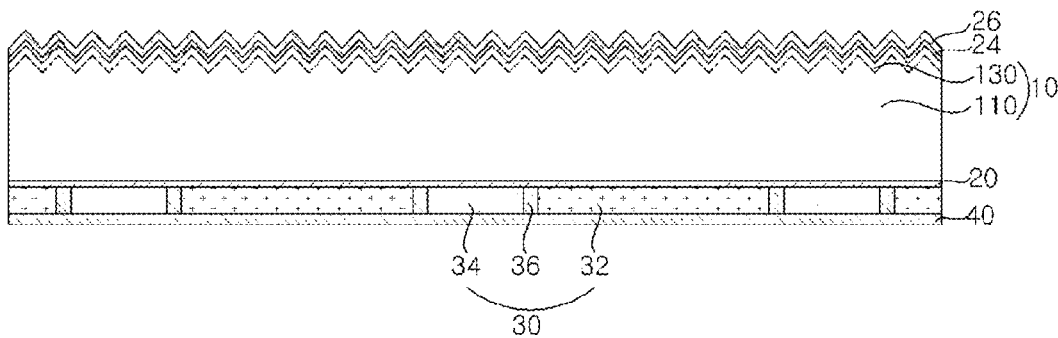
Figure 10D:
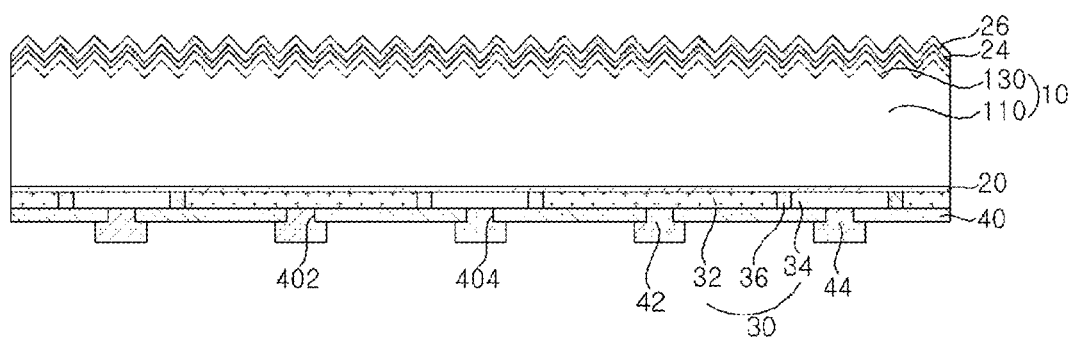

In the present embodiment, the front and back passivation films 24 and 40, which are located on opposite sides of the semiconductor substrate 10, are formed at the same time, such that the front passivation film 24 is used on the front surface without patterning, whereas the back passivation film 40 is patterned on the back surface as illustrated by example in FIG. 10D. This may simplify processing. However, the embodiment of the present invention is not limited thereto. The front passivation film 24 and the back passivation film 40 may be formed via different processes, and the above-described heat treatment process may be applied to at least one of the front passivation film 24 and the back passivation film 40. Alternatively, after both the front passivation film 24 and the back passivation film 40 are formed, one of them may be removed. Alternatively, the anti-reflection film 26 and the back passivation film 40 may be formed at the same time via the above-described heat treatment process. Various other alterations are possible.

Subsequently, as illustrated by example in FIG. 10C, in the present embodiment, the anti-reflection film 26 may be formed over the front passivation film 24. In one example, the anti-reflection film 26 may be formed over the entire front passivation film 24. The anti-reflection film 26 may be formed via any of various methods, such as vacuum deposition, chemical vapor deposition, spin coating, screen printing, or spray coating.

Subsequently, as illustrated by example in FIG. 10D, the first and second electrodes 42 and 44, which are connected respectively to the first and second conductive areas 32 and 34, are formed. The description with reference to FIG. 3F may be directly applied thereto, and thus, a detailed description thereof will be omitted.

Hereinafter, the present invention will be described in more detail with reference to Experimental Examples of the present invention. However, the Experimental Examples of the present invention are merely given to illustrate the present invention, and the embodiment of the present invention is not limited thereto.

Experimental Example 1

A solar cell having the structure illustrated in FIG. 1 was manufactured. At this time, a silicon oxide layer, which has a thickness of 2 nm, was formed via thermal oxidation in a heat treatment process, which was performed at a temperature of 700 degrees Celsius under a gas atmosphere including $Cl_2$ gas, $O_2$ gas and $N_2$ gas. The formed silicon oxide layer was included as a control passivation layer. In the heat treatment process, the ratio of $O_2$ gas:$Cl_2$ gas was 1:0.1.

Experimental Example 2

A solar cell having the structure illustrated in FIG. 1 was manufactured. At this time, after a thin oxide film was formed while a semiconductor substrate was being washed with a mixture solution of HCl and $H_2O_2$, the thin oxide film was subjected to a heat treatment process, which was performed at a temperature of 700 degrees Celsius under a gas atmosphere including $Cl_2$ gas, $O_2$ gas and $N_2$ gas. The formed silicon oxide layer, which has a thickness of 2 nm, was included as a control passivation layer. In the heat treatment process, the ratio of $O_2$ gas:$Cl_2$ gas was 1:0.1.

Comparative Example 1

A solar cell was manufactured by the same method as that of Experimental Examples except for the process of forming a control passivation layer. At this time, a silicon oxide layer, which has a thickness of 2 nm, was formed via thermal oxidation in a heat treatment process, which was performed at a temperature of 500 degrees Celsius under a gas atmosphere including $Cl_2$ gas, $O_2$ gas and $N_2$ gas. The formed silicon oxide layer was included as a control passivation layer.

Comparative Example 2

A solar cell was manufactured by the same method as that of Experimental Examples except for the process of forming a control passivation layer. At this time, a silicon oxide layer was formed via thermal oxidation in a heat treatment process, which was performed at a temperature of 700 degrees Celsius under a gas atmosphere including $O_2$ gas and $N_2$ gas. The formed silicon oxide layer, which has a thickness of 2 nm, was included as a control passivation layer.

Figure 11:
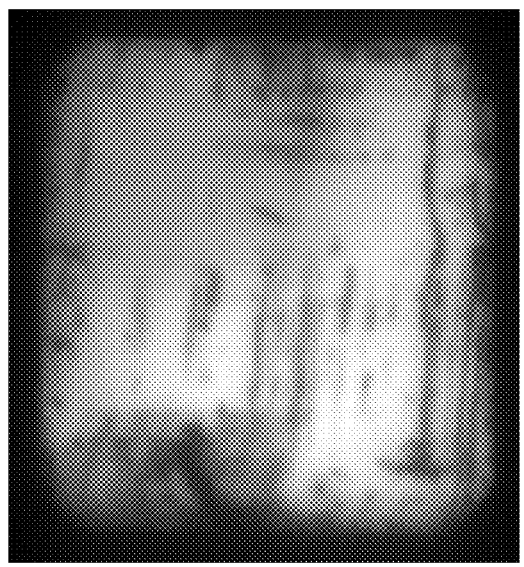
FIG. 11 is a photoluminescence (PL) photograph of the solar cell in accordance with Experimental Example 1.
Figure 12:
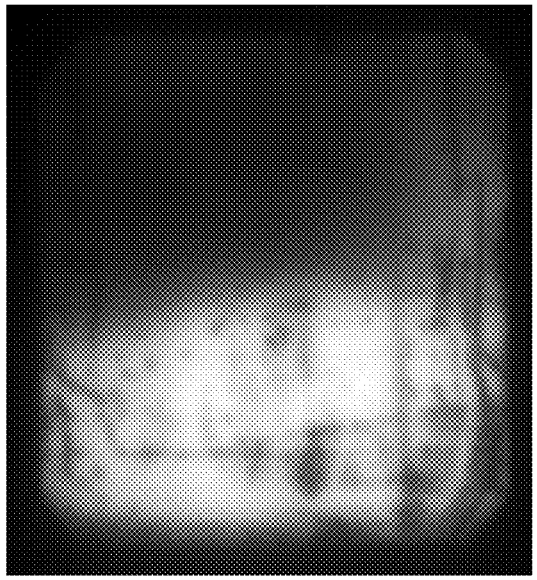
FIG. 12 is a PL photograph of the solar cell in accordance with Comparative Example 1.
Figure 13:
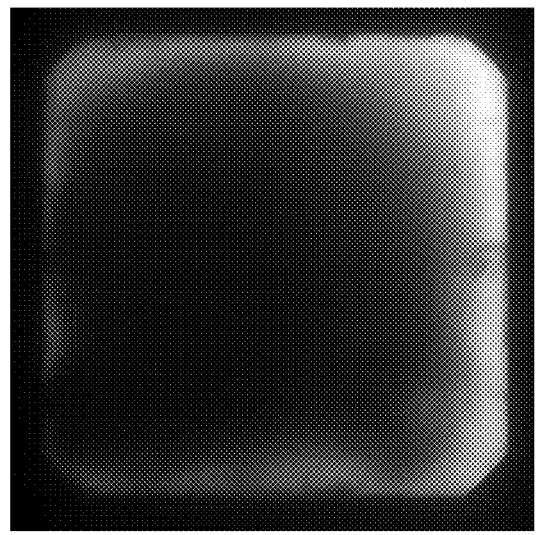
FIG. 13 is a PL photograph of the solar cell in accordance with Comparative Example 2.

Photoluminescence (PL) photographs of the solar cells in accordance with Experimental Example 1 and Comparative Examples 1 and 2 were captured. The PL photograph of the solar cell in accordance with Experimental Example 1 is illustrated in FIG. 11, the PL photograph of the solar cell in accordance with Comparative Example 1 is illustrated in FIG. 12, and the PL photograph of the solar cell in accordance with Comparative Example 2 is illustrated in FIG. 13. In the PL photographs, a bright portion is a portion in which no metal impurities, defects, and the like are present, and a dark portion is a portion in which metal impurities, defects, and the like are present.

Referring to FIG. 11, it will be appreciated that the solar cell in accordance with Experimental Example 1 appears bright in light in general, and thus substantially no metal impurities, defects, and the like are present. On the other hand, referring to FIG. 12, it will be appreciated that the solar cell in accordance with Comparative Example 1 has a black portion, and thus metal impurities, defects, and the like are present on the corresponding portion. In addition, referring to FIG. 13, it will be appreciated that the solar cell in accordance with Comparative Example 2 appears black in general, and thus many impurities, defects, and the like are present in the solar cell.

As described above, in Experimental Example 1 and Comparative Examples 1 and 2, all other manufacturing processes are the same, and only the process of forming the control passivation layer is different. Accordingly, it will be appreciated that the control passivation layer having good properties was formed in a heat treatment process, which was performed at a heat treatment temperature of 600 degrees Celsius or more under a gas atmosphere including halogen gas. In addition, it will be appreciated that the control passivation layer having good properties was not formed in Comparative Example 1 in which the heat treatment process was performed at a heat treatment temperature below 600 degrees Celsius even if a gas atmosphere including halogen gas is provided, and in Comparative Example 2 in which the heat treatment process was performed under a gas atmosphere including halogen gas even if a heat treatment temperature is 600 degrees Celsius or more.

Figure 14:
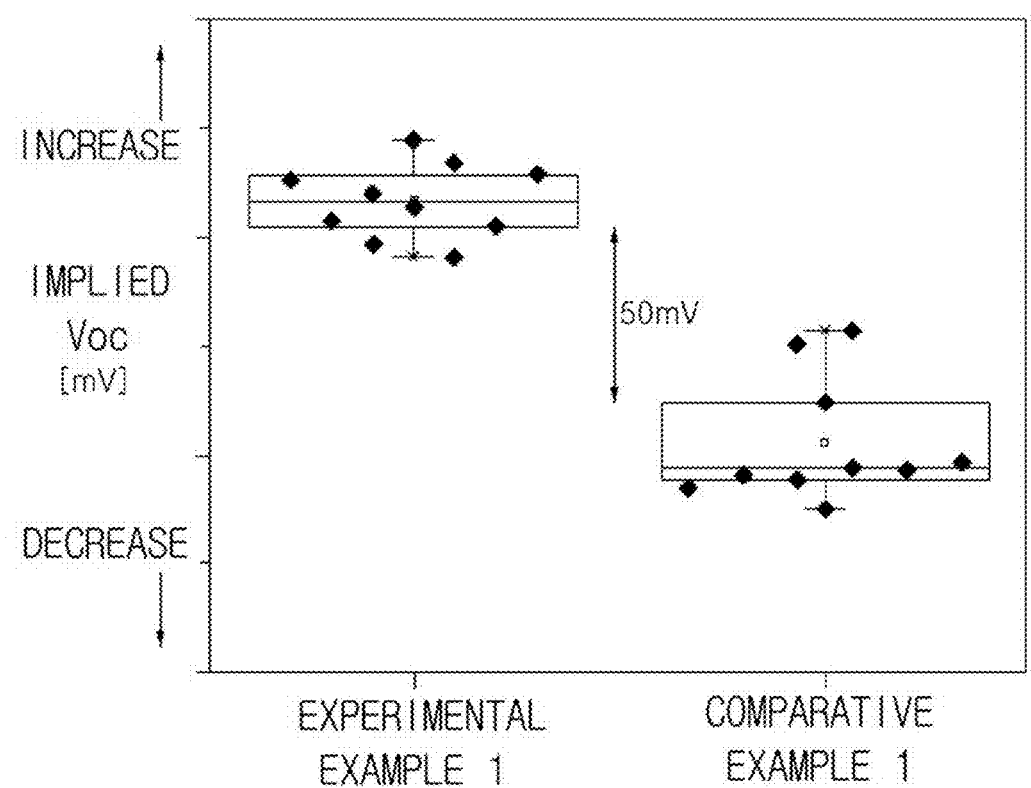
FIG. 14 is a graph illustrating results of measuring the implied open-circuit voltages of the solar cells in accordance with Experimental Example 1 and Comparative Example 1.

The results of measuring implied open-circuit voltages Voc of the solar cells in accordance with Experimental Example 1 and Comparative Example 1 are illustrated in FIG. 14. Referring to FIG. 14, it will be appreciated that the implied open-circuit voltage of the solar cell in accordance with Experimental Example 1 is higher than the implied open-circuit voltage of the solar cell in accordance with Comparative Example 1 by about 50 mV. The control passivation layer in accordance with Experimental Example 1 in which the heat treatment process was performed at a heat treatment temperature of 600 degrees Celsius or more under a gas atmosphere including halogen gas has a low interface trap density, and thus it is expected that the solar cell including the same has a high implied open-circuit voltage. On the other hand, the control passivation layer, which was formed at a heat treatment temperature of 600 degrees Celsius or less as in Comparative Example 1 has a higher interface trap density than that in Experimental Example 1, and thus it is expected that the solar cell including the same has a relatively low implied open-circuit voltage.

Figure 15:
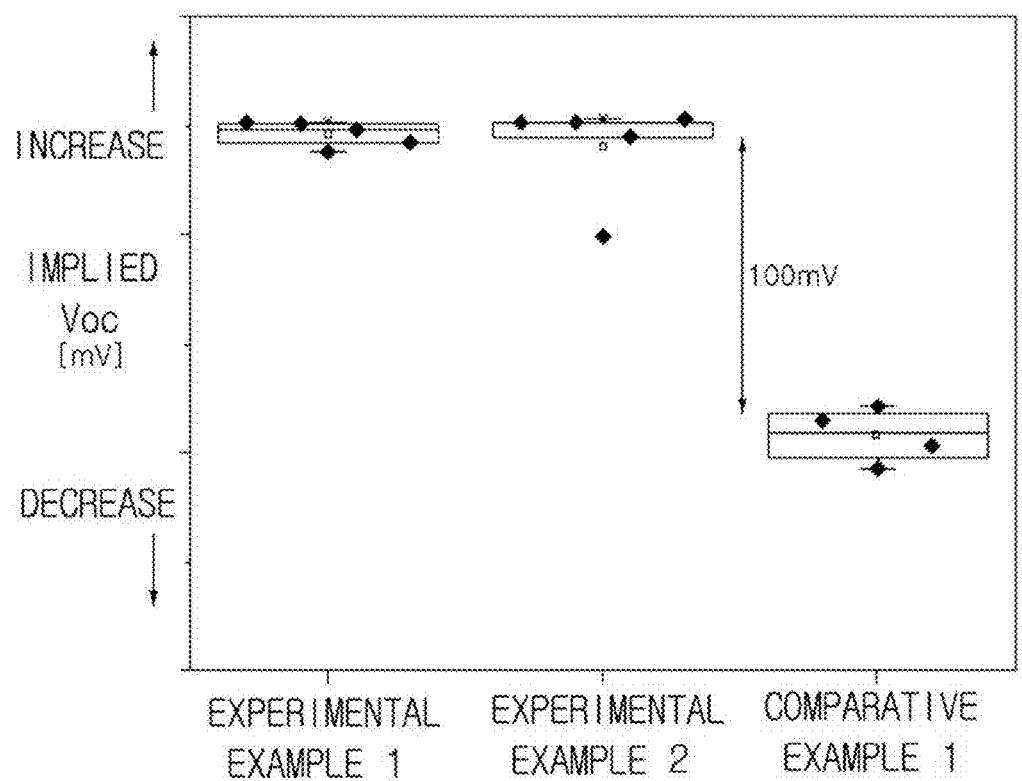
FIG. 15 is a graph illustrating results of measuring the implied open-circuit voltages of the solar cells in accordance with Experimental Examples 1 and 2 and Comparative Example 1, after performing additional heat treatment at the temperature of 900 degrees Celsius.

In addition, the results of measuring implied open-circuit voltages Voc of the solar cells in accordance with Experimental Examples 1 and 2 and Comparative Example 1 after performing additional heat treatment at a temperature of 900 degrees Celsius are illustrated in FIG. 15. It will be appreciated that the implied open-circuit voltages of the solar cells in accordance with Experimental Examples 1 and 2 are higher than the implied open-circuit voltage of the solar cell in accordance with Comparative Example 1 by about 100 mV. Thereby, it will be appreciated that the solar cells in accordance with Experimental Examples 1 and 2 have good stability even in a subsequent high-temperature process, whereas the properties of the solar cell in accordance with Comparative Example 1 may be deteriorated in a subsequent high-temperature process.

In accordance with the embodiments of the present invention, protective films including, for example, a control passivation layer and front and back passivation films are formed via a method including a heat treatment process, which is performed at a specific temperature under a gas atmosphere, thereby achieving improved properties and qualities. Thereby, the efficiency of the solar cell may be improved. In addition, the formed protective films may continuously maintain good qualities and properties in a subsequent high-temperature process, thus improving process stability.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A method of manufacturing a solar cell, the method comprising:
    forming a protective film using an insulation film over a semiconductor substrate, the semiconductor substrate including a base area of a first conductive type and formed of crystalline silicon,
    wherein the forming of the protective film includes a heat treatment process performed at a heat treatment temperature of 600 degrees Celsius or more under a gas atmosphere including a halogen gas, which has a halogen element, and
    wherein the heat treatment process includes a main section, during which the heat treatment temperature is maintained, a temperature increase section before the main section, during which an increase in temperature occurs from an introduction temperature to the heat treatment temperature, and a temperature reduction section after the main section, during which a reduction in temperature occurs from the heat treatment temperature to a discharge temperature.

2. The method according to claim 1, wherein the forming of the protective film includes at least one of the following:
    forming the protective film via thermal oxidation by performing the heat treatment process in a heat treatment furnace;

forming the protective film via deposition by performing the heat treatment process in a low-pressure chemical vapor deposition device; and forming the protective film by performing a wet chemical process or a dry process of forming a preliminary protective film at a temperature of 600 degrees Celsius or less, and thereafter thermally treating the preliminary protective film at a temperature of 600 degrees Celsius or more via the heat treatment process.

3. The method according to claim 1, wherein the halogen gas includes, as the halogen element, at least one of fluorine, chlorine, bromine, iodine, astatine, and ununseptium.

4. The method according to claim 3, wherein the halogen gas includes chlorine as the halogen element.

5. The method according to claim 4, wherein the halogen gas includes at least one of $Cl_2$, $C_2H_2Cl_2$, and HCl.

6. The method according to claim 1, wherein the gas atmosphere further includes oxygen gas as a source gas so that the protective film includes a silicon oxide layer, and wherein the halogen gas is included in a quantity equal to or less than a quantity of the oxygen gas.

7. The method according to claim 6, wherein a volume ratio of the oxygen gas to the halogen gas is within a range from 1:0.01 to 1:1.

8. The method according to claim 1, wherein the heat treatment temperature of the heat treatment process is within a range from 600 degrees Celsius to 900 degrees Celsius.

9. The method according to claim 1, wherein the introduction temperature or the discharge temperature is within a range from 400 degrees Celsius to 550 degrees Celsius.

10. The method according to claim 9, wherein the introduction temperature or the discharge temperature is within a range from 500 degrees Celsius to 550 degrees Celsius.

11. The method according to claim 1, further comprising, before the forming of the protective film, forming a conductive area, which is one of the first conductive type and has a higher doping concentration than that of the base area and a second conductive type opposite to the first conductive type, by doping an inside of the semiconductor substrate with a dopant, wherein, in the forming the protective film, the protective film is formed over the conductive area.

12. The method according to claim 11, wherein the protective film has a thickness within a range from 3 nm to 6 nm.

13. The method according to claim 1, further comprising, before the forming of the protective film, forming a conductive area over one surface of the semiconductor substrate, the conductive area having a different crystalline structure from that of the semiconductor substrate, wherein, in the forming of the protective film, the protective film is formed over the conductive area.

14. The method according to claim 13, wherein, in the forming of the conductive area, a first conductive area, which is of the first conductive type, and a second conductive area, which is of the second conductive type opposite to the first conductive type, are formed in the same plane over one surface of the semiconductor substrate, and wherein the protective film covers both the first conductive area and the second conductive area.

15. The method according to claim 14, wherein the protective film has a thickness within a range from 3 nm to 6 nm.

16. The method according to claim 1, wherein, in the forming of the protective film, the protective film is a control passivation layer formed over one surface of the semiconductor substrate, and wherein the method further comprises, after the forming of the protective film, forming a conductive area over the control passivation layer.

17. The method according to claim 16, wherein, in the forming the conductive area, a first conductive area, which is of the first conductive type, and a second conductive area, which is of a second conductive type opposite to the first conductive type, are formed in the same plane over the control passivation layer.

18. The method according to claim 16, wherein the control passivation layer has a thickness within a range from 1 nm to 2 nm.

19. The method according to claim 1, wherein the protective film is at least one of a first passivation film located over one surface of the semiconductor substrate and a second passivation film over a remaining surface of the semiconductor substrate.

20. The method according to claim 19, wherein the first passivation film and the second passivation film are formed at the same time via the heat treatment process.

* * * * *